United States Patent
Reid et al.

(10) Patent No.: US 9,971,384 B2
(45) Date of Patent: May 15, 2018

(54) PRINTED CIRCUIT BOARD FEATURES OF A PORTABLE COMPUTER

(71) Applicant: APPLE INC., Cupertino, CA (US)

(72) Inventors: Gavin J. Reid, Campbell, CA (US); Joss N. Giddings, San Francisco, CA (US); William F. Leggett, San Jose, CA (US); Thomas R. Tate, San Jose, CA (US); Gary S. Thomason, Boulder Creek, CA (US)

(73) Assignee: APPLE INC., Cupertino, CA (US)

( * ) Notice: Subject to any disclaimer, the term of this patent is extended or adjusted under 35 U.S.C. 154(b) by 0 days. days.

(21) Appl. No.: 15/354,543

(22) Filed: Nov. 17, 2016

(65) Prior Publication Data
US 2017/0068280 A1 Mar. 9, 2017

Related U.S. Application Data

(62) Division of application No. 13/855,681, filed on Apr. 2, 2013, now Pat. No. 9,538,632.
(Continued)

(51) Int. Cl.
| | |
|---|---|
| *H01R 12/00* | (2006.01) |
| *G06F 1/16* | (2006.01) |
| *H05K 1/02* | (2006.01) |
| *H05K 3/00* | (2006.01) |
| *H05K 3/30* | (2006.01) |
| *G06F 1/20* | (2006.01) |

(Continued)

(52) U.S. Cl.
CPC .............. *G06F 1/1662* (2013.01); *G06F 1/16* (2013.01); *G06F 1/1616* (2013.01); *G06F 1/1656* (2013.01); *G06F 1/203* (2013.01); *H01R 13/50* (2013.01); *H01R 13/6582* (2013.01); *H05K 1/02* (2013.01); *H05K 3/00* (2013.01); *H05K 3/30* (2013.01); *Y10T 29/4913* (2015.01); *Y10T 29/49124* (2015.01)

(58) Field of Classification Search
CPC .......... G06F 1/183; G06F 1/184; G06F 1/185; G06F 1/187; G06F 1/1607; G06F 1/203; G06F 11/3031; G06F 2009/45591
USPC ........................................... 439/76.1, 607.01
See application file for complete search history.

(56) References Cited

U.S. PATENT DOCUMENTS 5,422,784 A 6/1995 Wakahara et al.
5,455,746 A * 10/1995 Sato ..................... G06F 1/1616
174/17 R (Continued)

OTHER PUBLICATIONS

Final Office Action dated May 18, 2016 for U.S. Appl. No. 13/855,681 in 11 pages.
(Continued)

*Primary Examiner* — Abdullah Riyami
*Assistant Examiner* — Vladimir Imas
(74) *Attorney, Agent, or Firm* — Kilpatrick Townsend and Stockton, LLP

(57) ABSTRACT

Tools and fixtures for assembling a printed circuit board (PCB), such as a main logic board (MLB), in a portable computer device are described. A connector assembly having an electrically conductive gasket mounted on an edge of the MLB is described. In addition, a keyboard assembly including a notched portion of the MLB for accommodating more than one type of keyboard is described. In addition, a PCB assembly having a bracket to support a weak region of the PCB during assembly is described.

22 Claims, 22 Drawing Sheets

Related U.S. Application Data

(60) Provisional application No. 61/795,542, filed on Oct. 18, 2012.

(51) Int. Cl.
*H01R 13/50* (2006.01)
*H01R 13/6582* (2011.01)

(56) References Cited

U.S. PATENT DOCUMENTS

| | | | | |
|---|---|---|---|---|
| 5,600,538 A * | 2/1997 | Xanthopoulos | ......... | G06F 1/181 361/679.46 |
| 5,689,400 A * | 11/1997 | Ohgami | ................ | G06F 1/1616 361/679.27 |
| 5,694,124 A | 12/1997 | Wood | | |
| 5,796,579 A * | 8/1998 | Nakajima | ............. | G06F 1/1616 361/679.32 |
| 5,959,131 A | 9/1999 | Blaurock et al. | | |
| 6,088,221 A * | 7/2000 | Bolognia | ................ | G06F 1/184 312/223.2 |
| 6,233,142 B1 * | 5/2001 | Kerrigan | ................ | G06F 1/184 312/223.2 |
| 6,247,944 B1 * | 6/2001 | Bolognia | ................ | G06F 1/184 439/157 |
| 6,307,742 B1 * | 10/2001 | Diaz | ........................ | G06F 1/181 292/148 |
| 6,331,933 B1 * | 12/2001 | Rumney | ................ | G06F 1/184 174/541 |
| 6,356,457 B1 * | 3/2002 | Haworth | ................ | G06F 1/184 206/706 |
| 6,394,817 B1 * | 5/2002 | Kihira | ................ | H01R 13/701 439/63 |
| 6,407,921 B1 * | 6/2002 | Nakamura | ............. | G06F 1/203 165/104.33 |
| 6,437,980 B1 * | 8/2002 | Casebolt | ................ | G06F 1/183 165/104.21 |
| 6,466,433 B1 * | 10/2002 | Diaz | ........................ | G06F 1/181 292/148 |
| 6,510,052 B2 * | 1/2003 | Ishikawa | ............... | F28D 1/0308 165/104.33 |
| 6,522,547 B1 * | 2/2003 | Diaz | ........................ | G06F 1/181 312/223.1 |
| 6,574,101 B2 * | 6/2003 | Tanaka | .................... | G06F 1/203 165/80.3 |
| 6,708,740 B2 | 3/2004 | Wessberg | | |
| 6,709,286 B1 | 3/2004 | Korsunsky et al. | | |
| 6,749,448 B2 | 6/2004 | Bright et al. | | |
| 6,943,287 B2 | 9/2005 | Lloyd et al. | | |
| 6,967,837 B2 * | 11/2005 | Shih | ........................ | G06F 1/183 361/679.02 |
| 7,310,227 B2 * | 12/2007 | Kusamoto | ............. | G06F 1/203 174/16.1 |
| 7,473,131 B2 | 1/2009 | Dunwoody et al. | | |
| 7,558,059 B2 * | 7/2009 | Kamikakoi | ........... | G06F 1/1616 361/679.4 |
| 7,580,265 B2 * | 8/2009 | Kumagai | ................ | G06F 1/203 257/719 |
| 7,688,587 B2 * | 3/2010 | Ishikawa | ................ | G06F 1/203 165/80.3 |
| 7,952,872 B1 * | 5/2011 | Hata | ........................ | G06F 1/203 361/679.48 |
| 7,965,518 B2 * | 6/2011 | Yoshida | .................. | G06F 1/183 361/796 |
| 8,040,688 B2 * | 10/2011 | Tatsukami | ............ | G06F 1/1616 361/807 |
| 8,107,239 B2 * | 1/2012 | Fujiwara | ............... | F04D 25/068 361/694 |
| 8,339,775 B2 * | 12/2012 | Degner | ................. | G06F 1/1616 312/223.1 |
| 8,363,392 B2 * | 1/2013 | Tanaka | .................. | G06F 1/1613 361/679.02 |
| 8,411,434 B2 * | 4/2013 | Goh | ........................ | G06F 1/181 361/679.04 |
| 8,553,398 B2 * | 10/2013 | Tatsukami | ............ | G06F 1/1616 361/679.02 |
| 8,593,805 B2 * | 11/2013 | Chen | ........................ | G06F 1/203 165/104.33 |
| 8,599,548 B2 * | 12/2013 | Chiu | ........................ | G06F 1/183 361/679.31 |
| 8,605,456 B2 * | 12/2013 | Brad | ........................ | G06F 1/185 361/784 |
| 8,717,762 B2 * | 5/2014 | Fujiwara | ............... | F04D 25/068 361/694 |
| 9,538,632 B2 * | 1/2017 | Reid | ........................ | H05K 1/02 |
| 2003/0161102 A1 * | 8/2003 | Lee | ........................ | G06F 1/203 361/679.48 |
| 2007/0232118 A1 | 10/2007 | Wu | | |
| 2008/0037227 A1 * | 2/2008 | Fujiwara | ................ | G06F 1/203 361/722 |
| 2009/0168348 A1 * | 7/2009 | Letourneau | ........... | H01L 23/467 361/695 |
| 2010/0029104 A1 | 2/2010 | Patel et al. | | |
| 2010/0067188 A1 * | 3/2010 | Tanaka | .................. | G06F 1/1656 361/679.33 |
| 2011/0206328 A1 | 8/2011 | Wang | | |
| 2012/0106067 A1 * | 5/2012 | Goh | ........................ | G06F 1/181 361/679.37 |
| 2012/0160978 A1 * | 6/2012 | Chiu | ........................ | G06F 1/186 248/309.1 |

OTHER PUBLICATIONS

Notice of Allowance dated Sep. 2, 2016 for U.S. Appl. No. 13/855,681 in 12 pages.

* cited by examiner

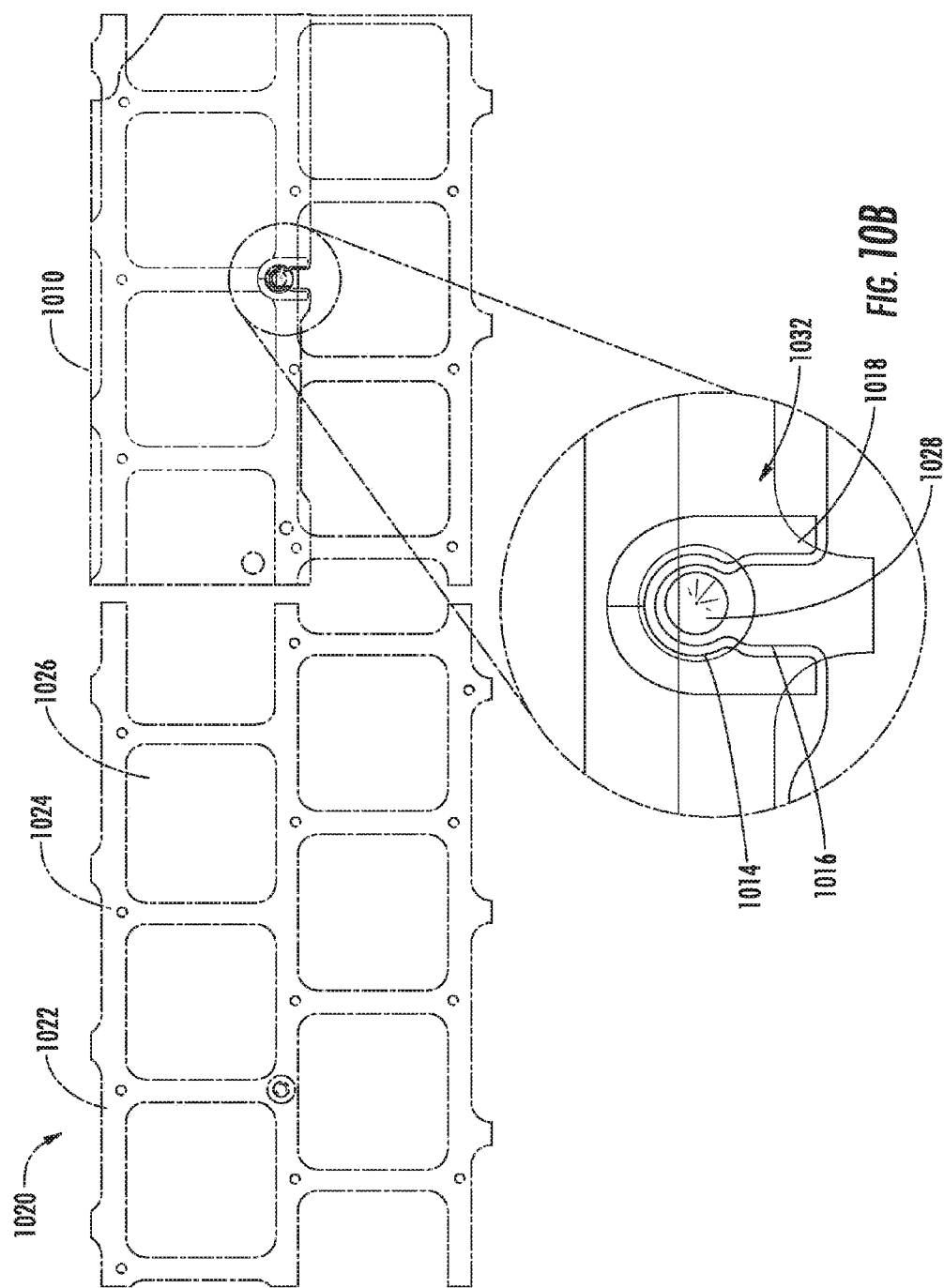

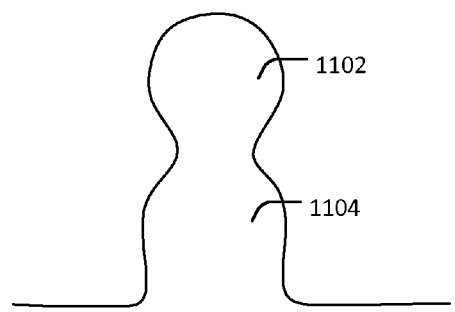
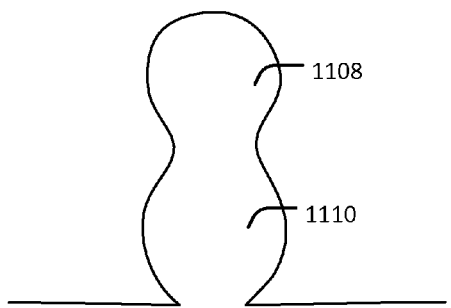
FIG. 11A        FIG. 11B
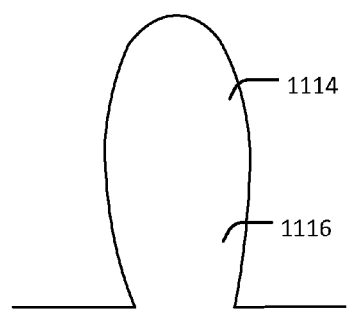
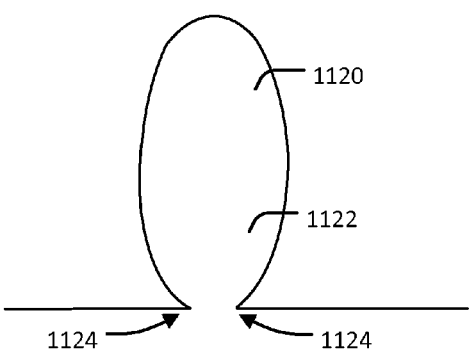
FIG. 11C        FIG. 11D

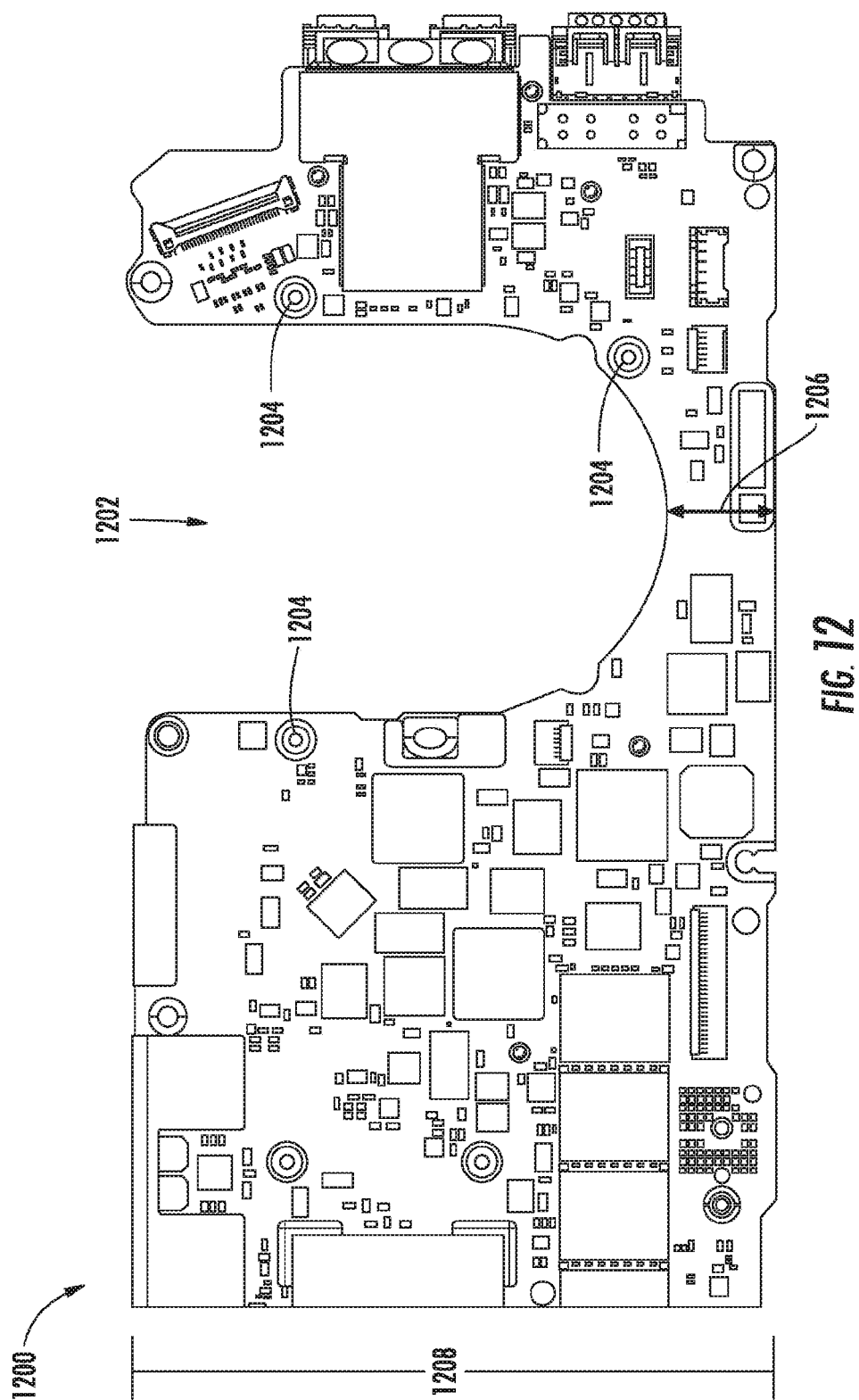

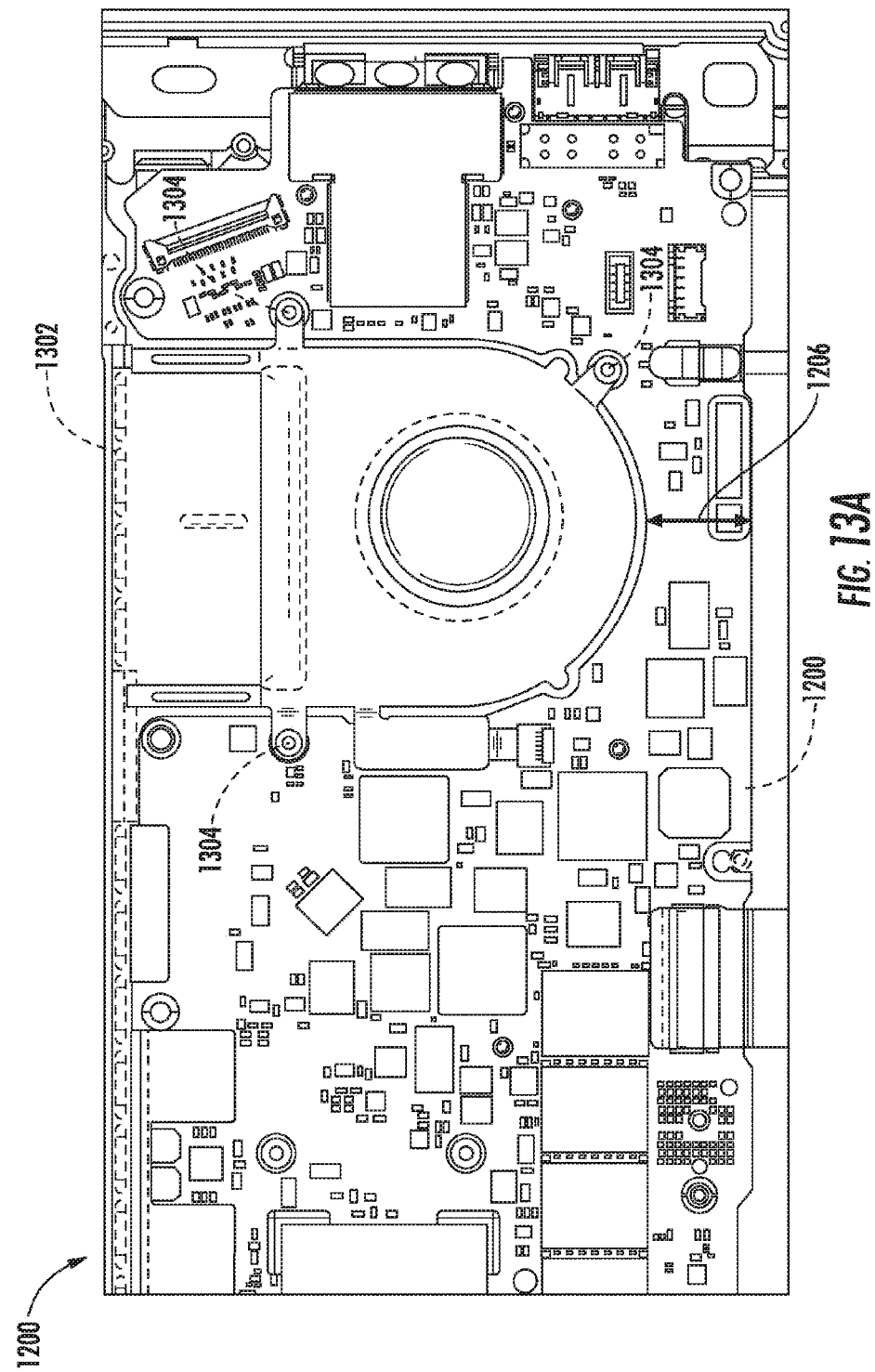

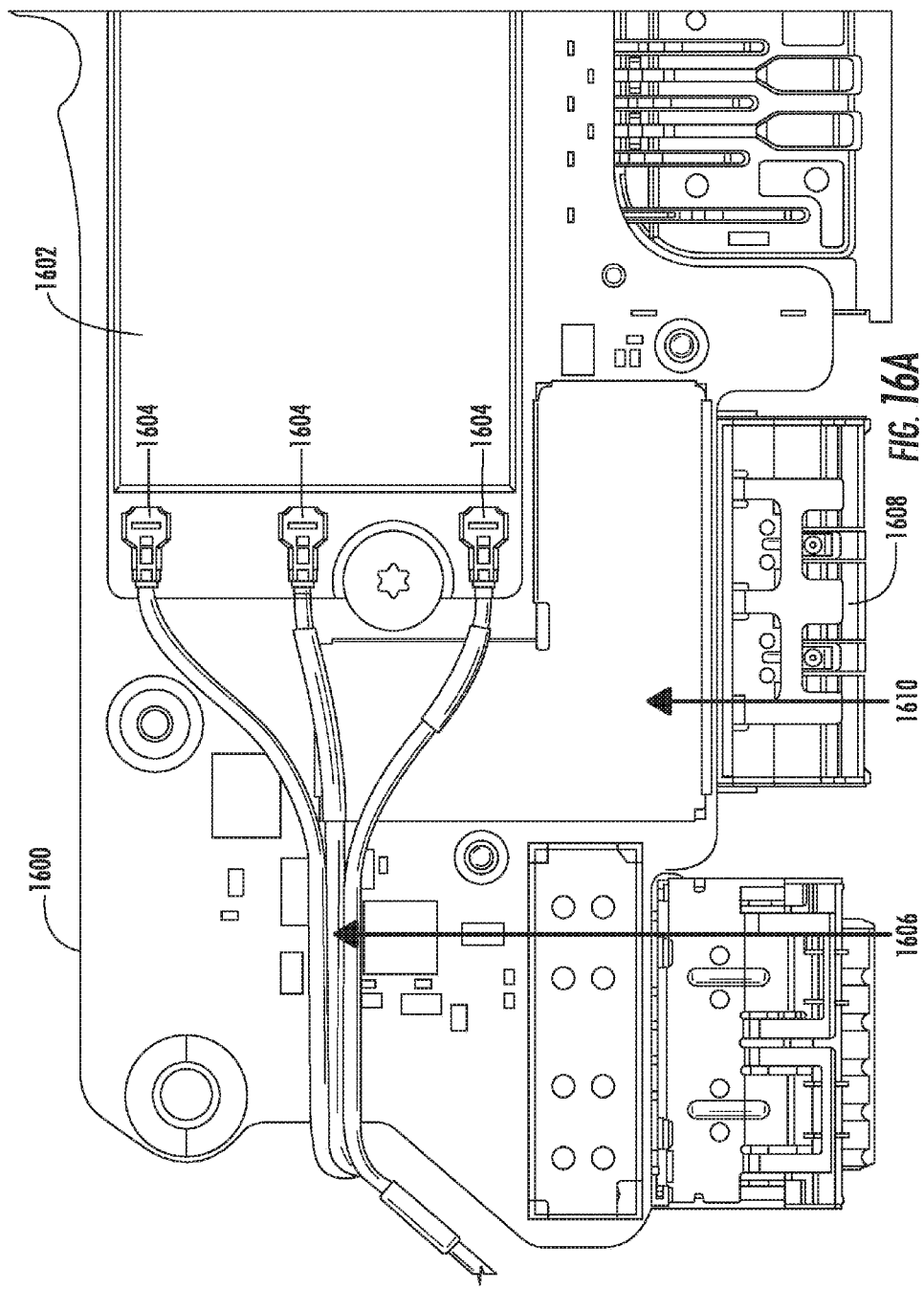

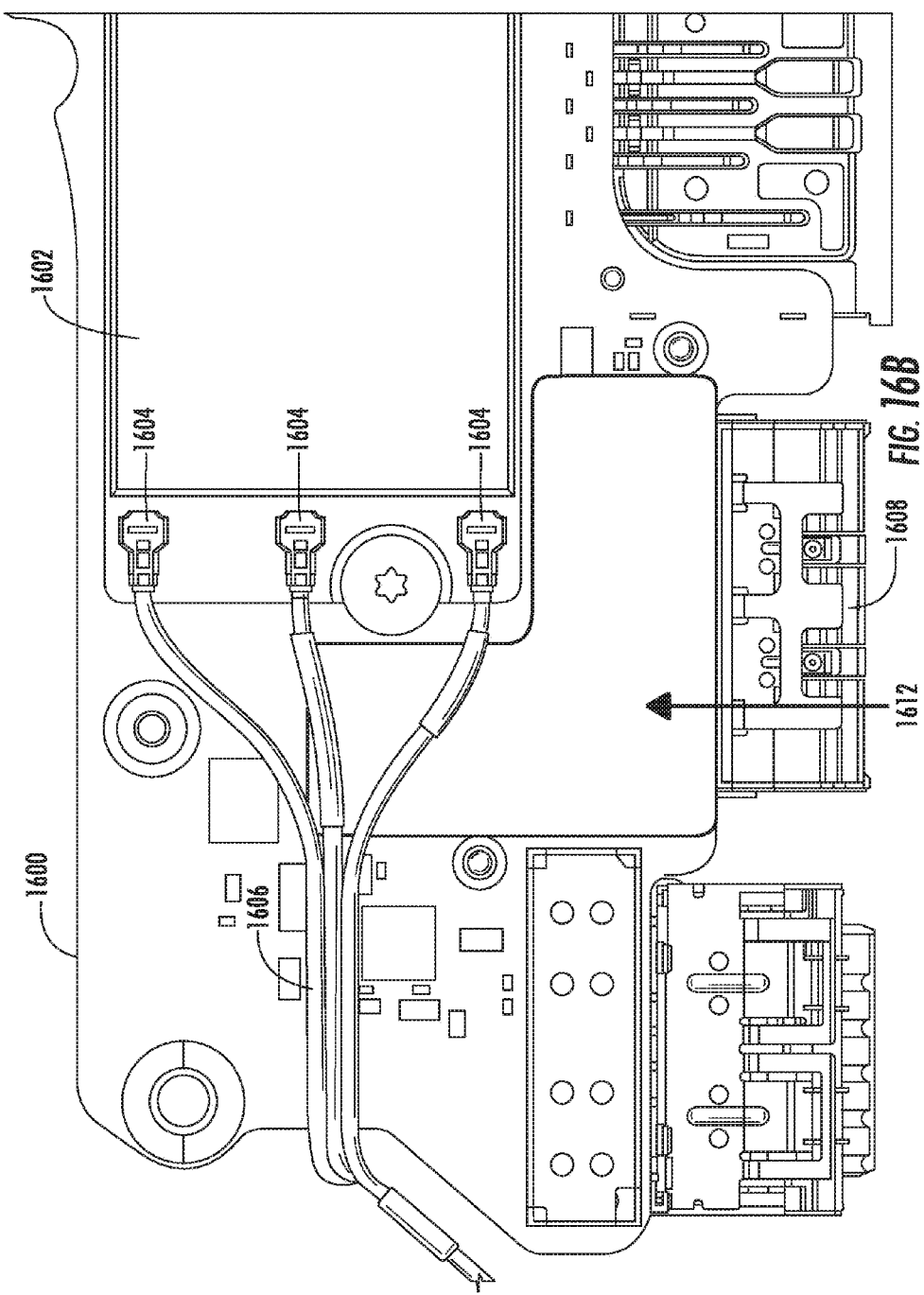

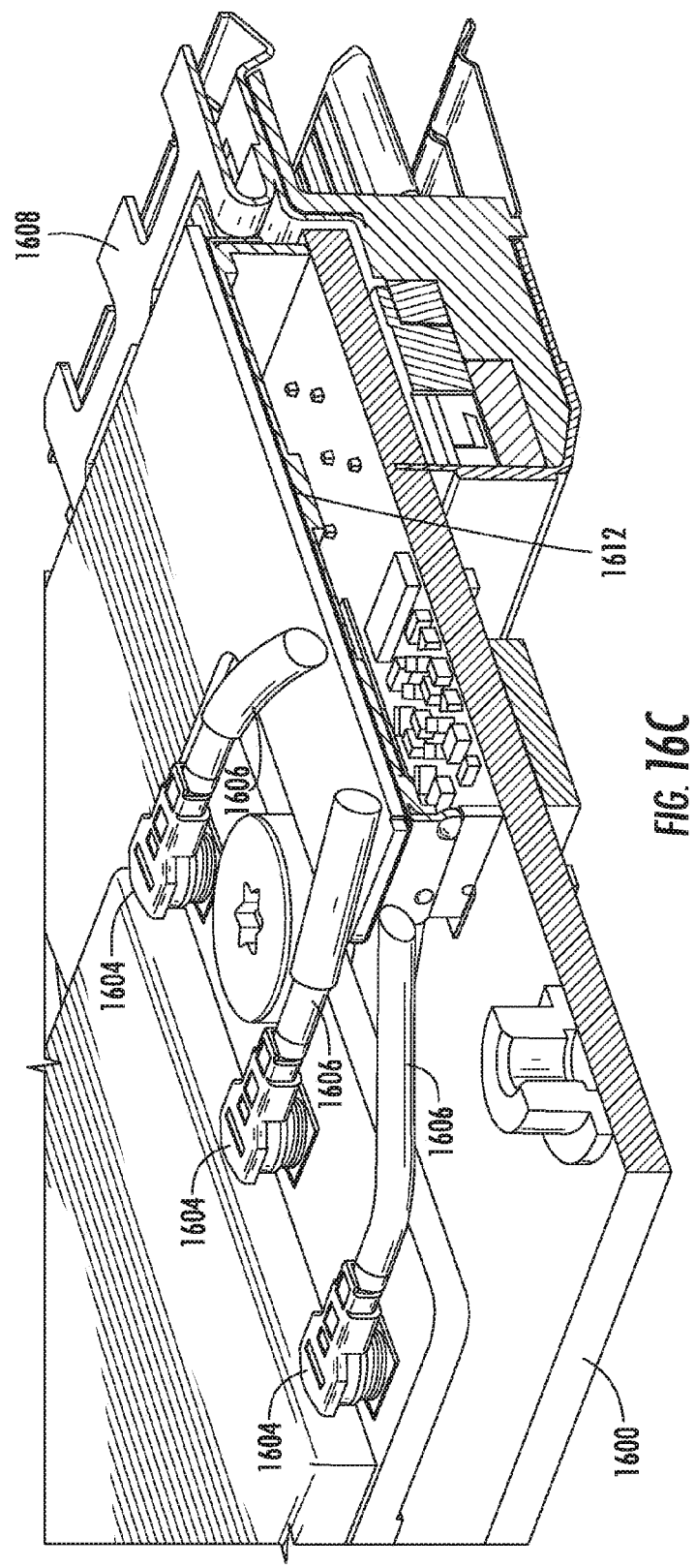

PRINTED CIRCUIT BOARD FEATURES OF A PORTABLE COMPUTER

CROSS REFERENCE TO RELATED APPLICATIONS

This application is a divisional of co-pending commonly assigned U.S. patent application Ser. No. 13/855,681 filed Apr. 2, 2013 entitled "Printed Circuit Board Features of a Portable Computer", which claims priority under 35 USC 119(e) to U.S. Provisional Patent Application No. 61/795,542 filed Oct. 18, 2012 entitled "Printed Circuit Board Features of a Portable Computer" by Smith et al. which is incorporated by reference in its entirety for all purposes.

FIELD OF THE DESCRIBED EMBODIMENTS

The described embodiments relate generally to portable computing devices. More specifically, the present embodiments relate to various features of printed circuit boards (PCBs), such as the main logic board (MLB), of the portable computing device. Methods include the use of fixtures during the assembly of PCBs in the portable computing devices.

BACKGROUND

The assembly of computer devices involves the positioning of many different components within regions of the housings of the computer devices. The positioning of the components in relation to each other is an important design consideration to assure that the components can adequately communicate with each other and not interfere with each other during operation of the computer. For portable computers in particular, it is also important that the components are securely fixed within the housings to withstand any jostling and vibrations associated with ordinary use.

The main logic board (MLB), which is the main circuit board of a portable computer, typically contains the central processing unit and main system memory as well as circuitry that controls the disk drives, keyboard, monitor, and other peripheral devices. Because of its central role, it is important that the MLB be positioned within the housing such that other components can adequately communicate with the MLB. It is also important that the MLB be adequately secured and protected to avoid damage to the MLB during and after assembly of the portable computer.

SUMMARY

This paper describes various embodiments that relate to features related to printed circuit boards (PCBs) such as the main logic board (MLB) of a portable computing device. Methods, fixtures and devices used for assembling an MLB in a portable computer device are described.

According to one embodiment described herein, a connector assembly having an electrically conductive gasket is mounted on an edge of the MLB is described. The connector assembly includes a receptacle configured to accept a connector, the connector being configured to connect to and communicate with an external electronic device. The connector assembly also includes an opening formed in a housing of the portable computing device, the opening being configured to conform to the receptacle. The connector assembly further includes an electrically conductive gasket. The electrically conductive gasket can have an elongated portion configured to provide mechanical and electrical contact with a portion of the housing of the portable computing device, and at least one finger portion that is mechanically and electrically coupled to the elongated portion. The at least one finger portion can be electrically coupled to the receptacle such that a ground path is formed between the external electronic device and the housing of the portable computing device via the electrically conductive gasket.

According to another embodiment, a keyboard assembly including a notched portion of the MLB is described. The keyboard assembly includes a first web having a first support structure and a number of first openings configured to accept a set of first keys. The first support structure can have a first boss configured to accept a first fastener. The keyboard assembly also includes a main logic board configured to accept input from the set of first keys. The MLB has a notch corresponding to the first boss and is configured to accept the first fastener. The notch has a suitable size and shape to correspond to a second boss of a second web and configured to accept the second fastener. In this way, a single MLB design having a universal notch can be used for assembly with more than one type of keyboard layout (e.g., ANSI, JIS or ISO keyboard layouts).

According to another embodiment, a printed circuit board (PCB) assembly having a bracket to support a weak region of the PCB during assembly is described. The PCB can be part of the MLB of the portable computing device. The PCB assembly includes a base having a number of attachment features for attaching a number of components to the base. The base has a cut out having the size and shape to accept a part therein. Because of the cut out, the base has a mechanically weak region which can experience mechanical strain during handling when the cut out is empty. The PCB assembly also includes a bracket having a size an shape corresponding to the cut out, wherein the mechanically weak region can experience less mechanical strain when the bracket is positioned in the cut out and attached to the base compared to when the cut out is empty. Methods for assembling a PCB in a portable computing device are described. Methods can include first receiving a PCB having a base and a number of attachment features for attaching a number of components to the base. The cut out of the base can have the size and shape to accept a part therein, wherein the base has a mechanically weak region which can experience mechanical strain during handling when the cut out is empty. Next, a PCB assembly is formed by mounting a bracket in the cut out, the bracket having a size and shape corresponding to the cut out. As a result, the mechanically weak region can experience less mechanical strain when the bracket is positioned in the cut out and attached to the base compared to when the cut out is empty. Next, the PCB assembly is assembled in the portable computing device. Next, the bracket is removed from the cut out of the printed circuit board. Finally, the part is mounted in the cut out of the PCB.

According to another embodiment, a method for shielding an antenna cable situated on the MLB is described. Methods can include first receiving a PCB having: a base configured to accept a number of components; a radio card mounted on the base, the radio card having at least one connector for attaching an antenna cable thereto, where the radio card is configured to process radio signals received and/or transmitted from/to an antenna via the antenna cable; and a high-definition multimedia interface (HDMI) receptacle positioned at the edge of the base, where the HDMI receptacle is configured to connect to and communicate with a corresponding HDMI connector for an external device. Next, a shield is mounted on the base between the radio card and the HDMI receptacle, where the shield reduces the electromagnetic noise experienced by the radio card and the antenna cable generated by HDMI receptacle. Finally and a separator is disposed on at least a portion of the surface of the shield, where the separator reduces electromagnetic noise experienced by the antenna cable emitted from the shield by providing a distance gap between the antenna cable and the shield.

BRIEF DESCRIPTION OF THE DRAWINGS

The embodiments will be readily understood by the following detailed description in conjunction with the accompanying drawings with like reference numerals designating like structural elements, and in which:

FIGS. 10A and 10B illustrate bottom-up views of portions of keyboard assemblies showing a PCB notch to accommodate different keyboard layouts.

FIGS. 11A-11D illustrate different PCB notch shapes in accordance with described embodiments.

FIG. 12 illustrates a top-down view of a portion of an MLB of a portable computing device showing a cut out in the PCB.

FIGS. 13A and 13B illustrate top-down and isometric view, respectively, of the MLB of FIG. 12 with a fan installed in the cut out of the PCB.

FIG. 16A illustrates a top-down view of a portion of a MLB having a radio card, antenna cables, a high-definition multimedia interface and a shield.

FIGS. 16B and 16C illustrate top-down and isometric views, respectively, of the MLB of FIG. 16A having a separator mounted on the shield.

DETAILED DESCRIPTION OF SELECTED EMBODIMENTS

Figure 1:
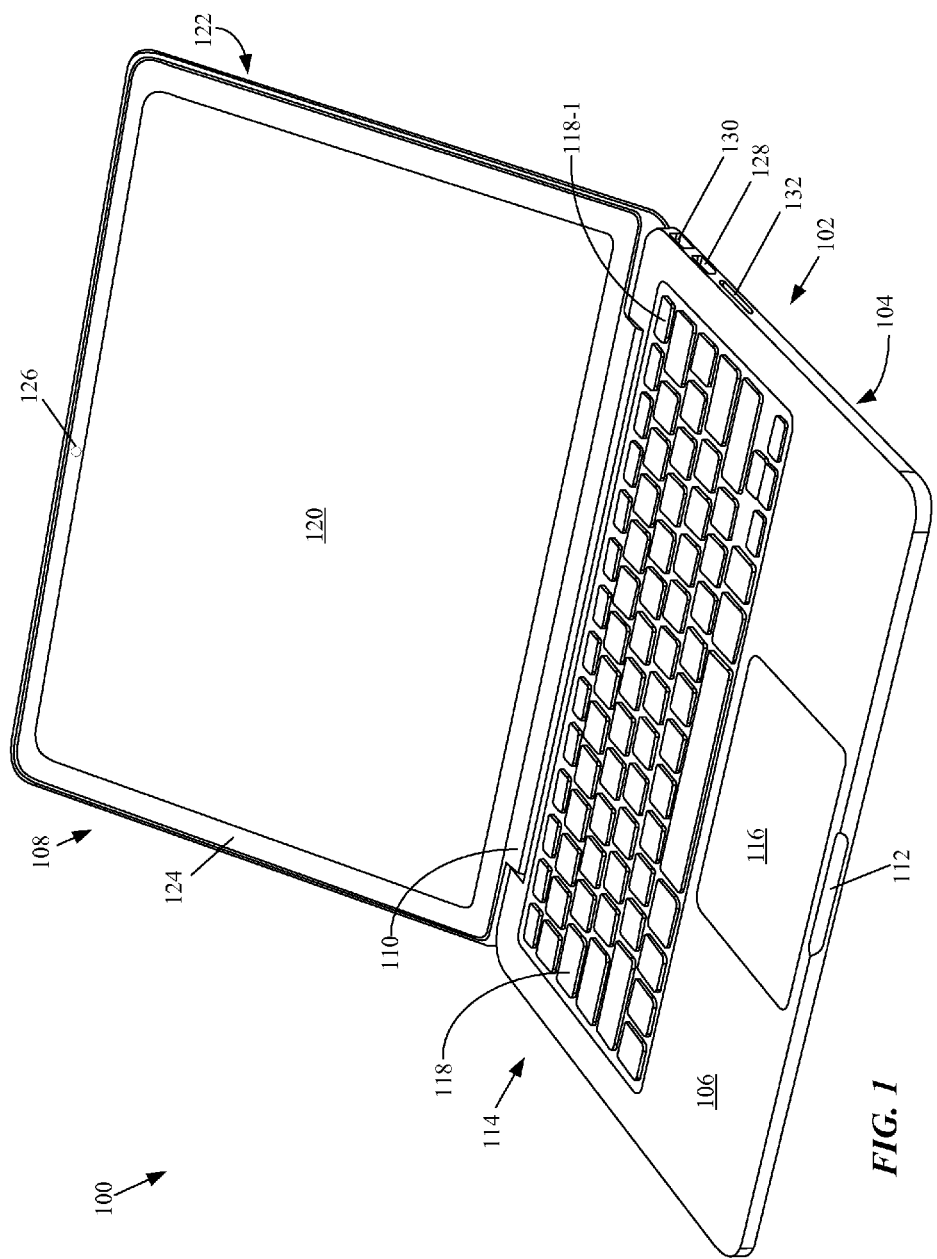
FIG. 1 shows a front facing perspective view of an embodiment of a portable computing device in an open (lid) state.

The following disclosure describes various embodiments of features within a portable computing device. Certain details are set forth in the following description and Figures to provide a thorough understanding of various embodiments of the present technology. Moreover, various features, structures, and/or characteristics of the present technology can be combined in other suitable structures and environments. In other instances, well-known structures, materials, operations, and/or systems are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods and components.

Representative applications of methods and apparatuses according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting, such that other embodiments may be used, and changes may be made without departing from the spirit and scope of the described embodiments.

The following describes methods and tools used for assembling a portable computing device. In particular, features of a main logic board (MLB) of a portable computing device are described. In general, the main logic board, sometimes referred to as the motherboard, is the main circuit board of a computer, usually containing the central processing unit and main system memory as well as circuitry and components for controlling disk drives, keyboard, monitor and other peripheral devices. The printed circuit board (PCB) of the MLB typically has a non-conductive base or substrate that has components mounted thereon and electrically conductive pathways laminated on the base to connect the various components. The embodiments described herein involve improved features of an MLB of a portable computing device. Some features can aid in the assembly of the MLB in the housing of the portable computing device. Other features provide ways to adequately secure the MLB inside the housing of the MLB. Other features can help improve the performance of components on the MLB.

These and other embodiments are discussed below with reference to FIGS. 1-17. However, those skilled in the art will readily appreciate that the detailed description given herein with respect to these figures is for explanatory purposes as the invention extends beyond these limited embodiments.

The portable computing device can include a multi-part housing having a top case and bottom case joined together to form a base portion. The portable computing device can have an upper portion (or lid) that can house a display screen and other related components. The base portion can house processors, drives, ports, a battery, a keyboard, a touch pad, etc. The upper portion can be pivotally connected to the bottom portion using clutch hinge assembly. The housing can be formed of a strong and durable yet lightweight material. Such materials can include composite materials or metals such as aluminum. Since aluminum is a good electrical conductor, a housing formed of aluminum can act as a chassis ground for internal electrical components arranged to fit and operate within the housing.

FIGS. 1-17 show various views of a portable computing device in accordance with various embodiments. FIG. 1 shows a front facing perspective view of an embodiment of a portable computing device in the form of portable computing device 100 in an open (lid) state. Portable computing device 100 can include base portion 102 formed of bottom case 104 fastened to top case 106. Base portion 102 can be pivotally connected to lid portion 108 by way of clutch assembly 110 hidden from view by a cosmetic wall. Base portion 102 can have an overall uniform shape sized to accommodate clutch assembly 110 and inset portion 112 suitable for assisting a user in lifting lid portion 108 by, for example, a finger. Top case 106 can be configured to accommodate various user input devices such as keyboard 114 and touchpad 116. Keyboard 114 can include a plurality of low profile keycap assemblies each having an associated key pad 118. The main logic board (MLB) (not shown) is positioned partially under keyboard 114 of portable computing device 100. In one embodiment, an audio transducer (not shown) can use selected portions of keyboard 114 to output audio signals such as music. In the described embodiment, a microphone can be located at a side portion of top case 106 that can be spaced apart to improve frequency response of an associated audio circuit.

Each of the plurality of key pads 118 can have a symbol imprinted thereon for identifying the key input associated with the particular key pad. Keyboard 114 can be arranged to receive a discrete input at each keypad using a finger motion referred to as a keystroke. In the described embodiment, the symbols on each key pad can be laser etched thereby creating an extremely clean and durable imprint that will not fade under the constant application of keystrokes over the life of portable computing device 100. In order to reduce component count, a keycap assembly can be re-provisioned as a power button. For example, key pad 118-1 can be used as power button 118-1. In this way, the overall number of components in portable computing device 100 can be commensurably reduced.

Touch pad 116 can be configured to receive finger gesturing. A finger gesture can include touch events from more than one finger applied in unison. The gesture can also include a single finger touch event such as a swipe or a tap. The gesture can be sensed by a sensing circuit in touch pad 116 and converted to electrical signals that are passed to a processing unit for evaluation. In this way, portable computing device 100 can be at least partially controlled by touch.

Lid portion 108 can be moved with the aid of clutch assembly 110 from the closed position to remain in the open position and back again. Lid portion 108 can include display 120 and rear cover 122 that can add a cosmetic finish to lid portion 108 and also provide structural support to at least display 120. In the described embodiment, lid portion 108 can include mask (also referred to as display trim) 124 that surrounds display 120. Display trim 124 can be formed of an opaque material such as ink deposited on top of or within a protective layer of display 120. Display trim 124 can enhance the overall appearance of display 120 by hiding operational and structural components as well as focusing attention onto the active area of display 120.

Display 120 can display visual content such as a graphical user interface, still images such as photos as well as video media items such as movies. Display 120 can display images using any appropriate technology such as a liquid crystal display (LCD), OLED, etc. Portable computing device 100 can also include image capture device 126 located on a transparent portion of display trim 124. Image capture device 126 can be configured to capture both still and video images. Lid portion 108 can be formed to have uni-body construction that can provide additional strength and resiliency to lid portion 108 which is particularly important due to the stresses caused by repeated opening and closing. In addition to the increase in strength and resiliency, the uni-body construction of lid portion 108 can reduce overall part count by eliminating separate support features.

Data ports 128-132 can be used to transfer data and/or power between an external circuit(s) and portable computing device 100. Data ports 128-132 can include, for example, input slot 132 that can be used to accept a memory card (such as a FLASH memory card), data ports 128 and 130 can take be used to accommodate data connections such as USB, FireWire, Thunderbolt, and so on. In some embodiments, an audio port embodied as part of keyboard 114 is used to port audio from an associated audio component enclosed within base portion 102.

Figure 2:
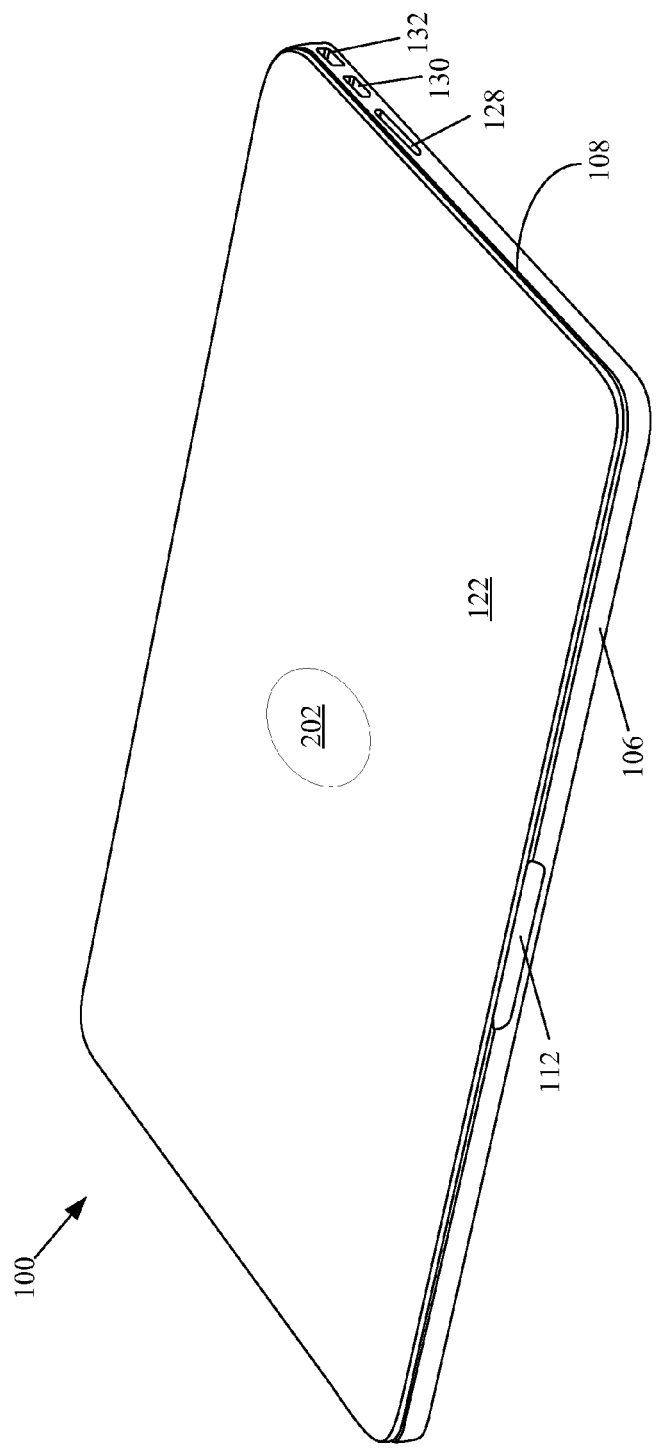
FIG. 2 shows the portable computing device of FIG. 1 in a closed (lid) state that shows rear cover and logo.

FIG. 2 shows portable computing device 100 in a closed (lid) configuration that shows rear cover 122 and logo 202. In one embodiment, logo 202 can be illuminated by light from display 120. It should be noted that in the closed configuration, lid portion 108 and base portion 102 form what appears to be a uniform structure having a continuously varying and coherent shape that enhances both the look and feel of portable computing device 100.

Figure 3:
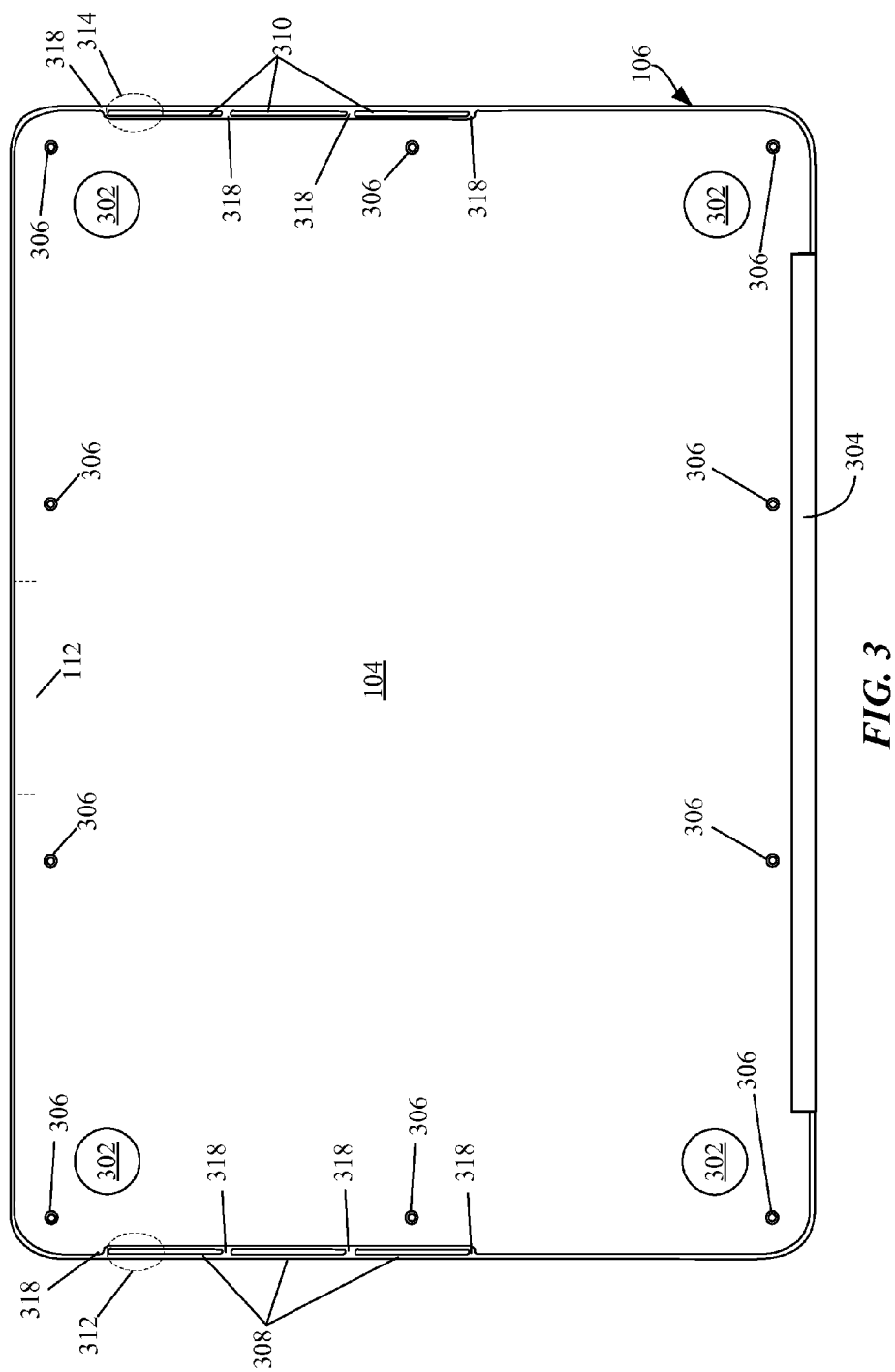
FIG. 3 shows an external view of bottom case of the portable computing device of FIGS. 1 and 2.

FIG. 3 shows an external view of bottom case 104 showing relative positioning of support feet 302, insert 112, cosmetic wall 304 that can be used to conceal clutch assembly 110 and fasteners 306 used to secure bottom case 104 and top case 106 together. Support feet 302 can be formed of wear resistant and resilient material such as plastic. Also in view are multi-purpose front side sequentially placed vents 308 and 310 that can be used to provide a flow of outside air that can be used to cool internal components. In the described embodiment, vents 308 and 310 can be placed on an underside of top cover 106 in order to hide the vents from view as well as obscure the view of an interior of portable computing device 100 from the outside. Vents 308 and 310 can act as a secondary air intake subordinate to primary air intake vents located at a rear portion of portable computing device 100 (described below). In this way, vents 308 and 310 can help to maintain an adequate supply of cool air in those situations where portions of the rear vents are blocked or otherwise have their air intake restricted.

Vents 308 and 310 can also be used to output audio signals in the form of sound generated by an audio module (not shown). In one embodiment, a selected portion (such as portions 312 and 314) can be used to output sound at a selected frequency range in order to improve quality of an audio presentation by portable computing device 100. Vents 308 and 310 can be part of an integrated support system in that vents 308 and 310 can be machined from the outside and cut from the inside during fabrication of top case 106. As part of the machining of vents 308 and 310, stiffener ribs 316 can be placed within vent openings 308 and 310 to provide additional structural support for portable computing device 100. Stiffener ribs 416 can be formed using what is referred to as a T cutter that removes material subsequent to the formation of the vent openings during the fabrication of top case 106.

Moreover, trusses 318 can be formed between vents 308 and 310 in combination with ribs 316 can add both structural support as well as assist in defining both the cadence and size of vents 308 and 310. The cadence and size of vents 308 and 310 can be used to control air flow into portable computing device 100 as well as emission of RF (radio frequency) energy in the form of EMI from portable computing device 100. Accordingly, stiffener ribs 316 can separate an area within vents 308 and 310 to produce an aperture sized to prevent passage of RF energy. As known from electromagnetic theory, the size of an aperture can restrict the emission of RF energy having a wavelength that can be "trapped" by the aperture. In this case, the size of vents 308 and 310 is such that a substantial portion of RF energy emitted by internal components can be trapped within portable computing device 100. Furthermore, by placing vents 308 and 310 at a downward facing surface of top case 106, the aesthetics of portable computing device 100 can be enhanced since views of internal components from an external observer are eliminated.

During assembly of the portable computing device 100 shown in FIGS. 1-3, the MLB is positioned inside base portion 102 such that components of on the MLB can communicate with each other, with other components of the portable computing device 100 or peripheral components. Various features involving the MLB of portable computing device 100 will be described below with reference to FIGS. 4-17, which illustrate various internal portions of portable computing device 100 during assembly processes.

Double Stack Gasket for Port Receptacles

Figure 4:
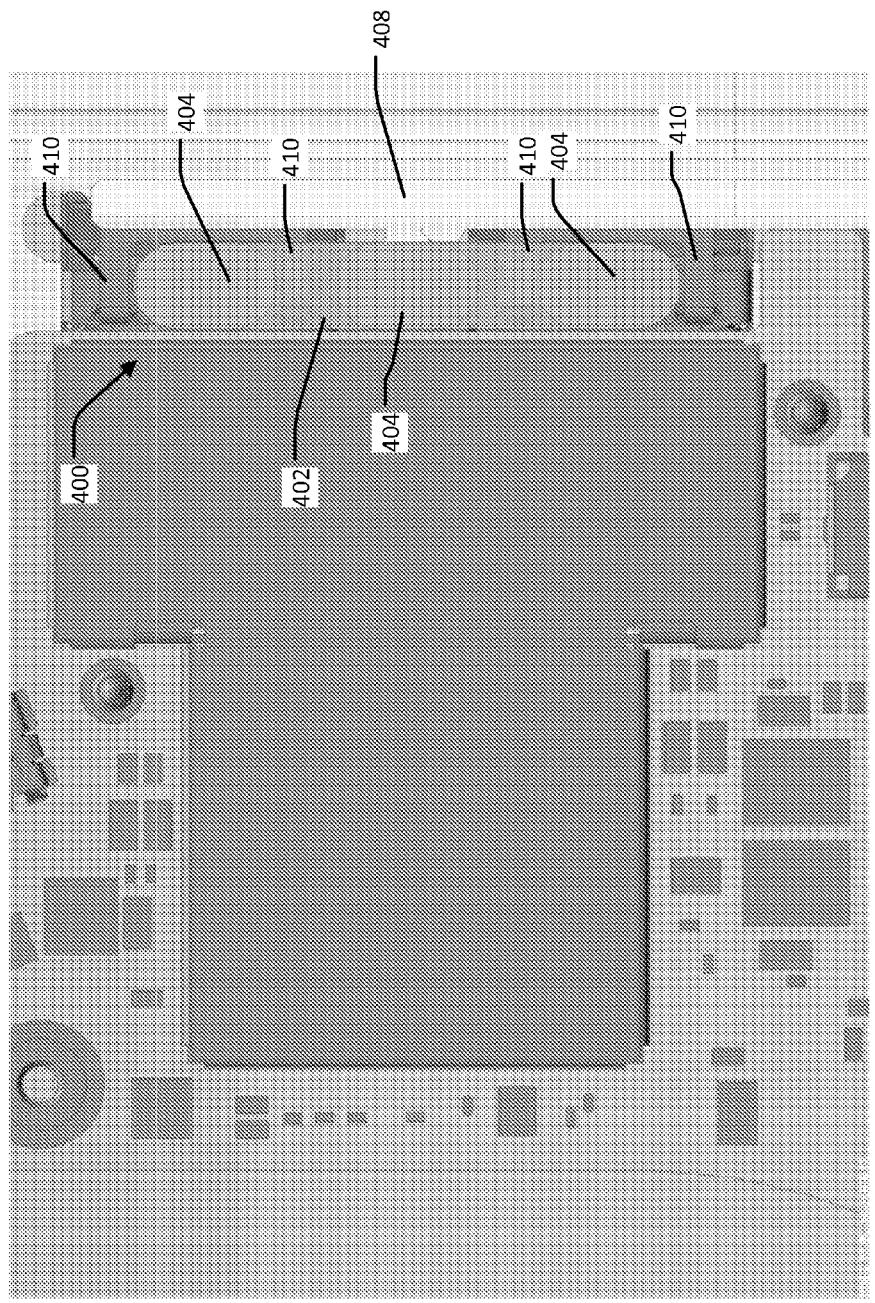
FIG. 4 illustrates a top view of an interior portion of a portable computing device having a double stack gasket as part of a connector assembly.
Figure 5:
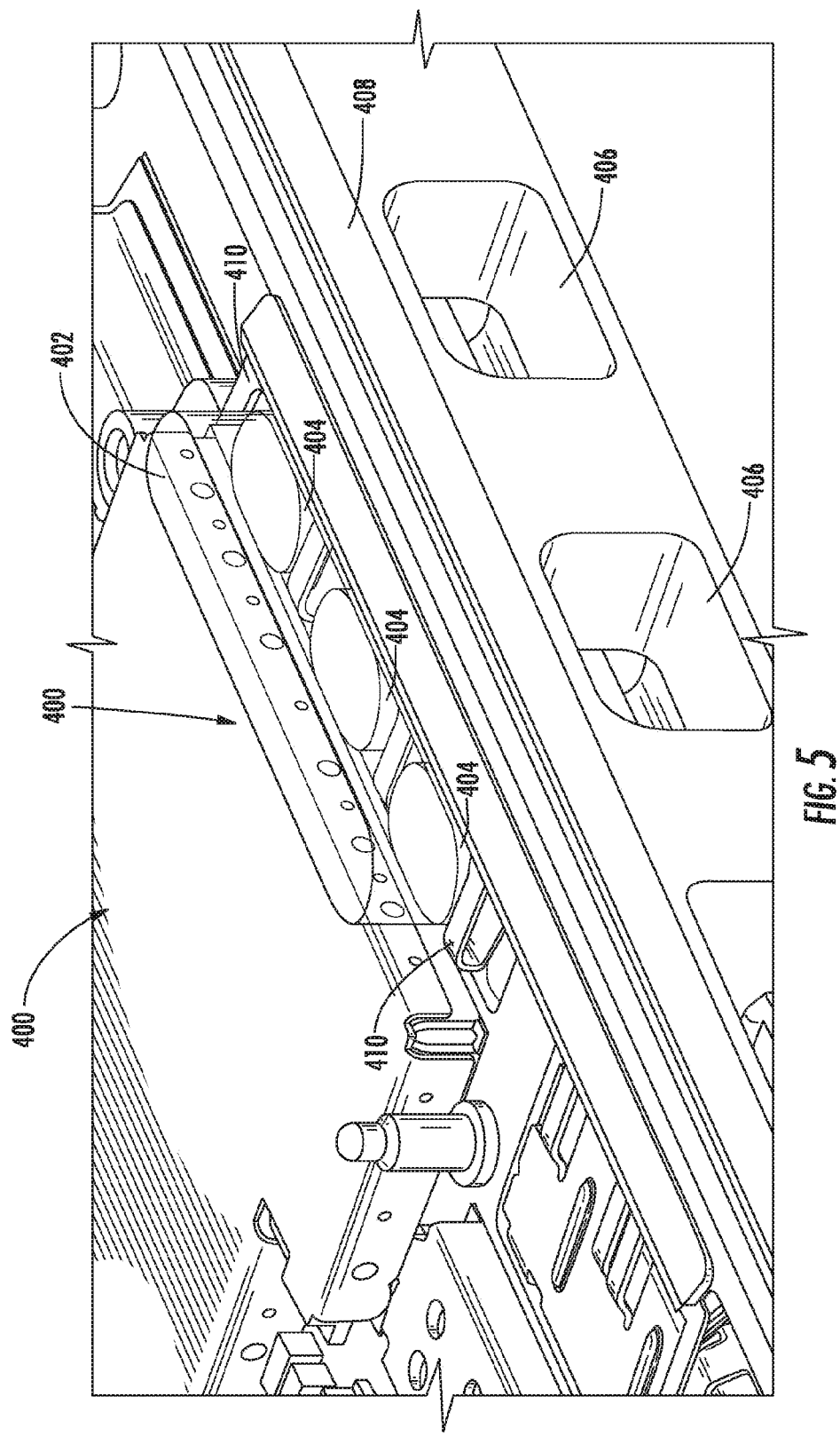
FIG. 5 illustrates a perspective view of the connector assembly of FIG. 4.

As described above with reference to FIGS. 1-3, data ports 128-132 can be used to transfer data and/or power between portable computing device 100 and external devices. Data ports 128-132 allow for communication between external devices and the MLB of portable computing device 100. The ports have receptacles that are configured to accommodate corresponding external connectors. The receptacles can accommodate, for example, USB, FireWire and Thunderbolt connectors. If the housing of the portable computer device is made of an electrically conductive material such as aluminum, the portions of the receptacles can be electrically coupled to the housing to provide an electrical ground for the connecting device. FIGS. 4 and 5 show close up top and perspective views of interior portions of portable computing device 100 illustrating a double stack gasket 400 as part of a connector assembly. External devices can be connected to the computer device via openings 406. Openings 406 are formed in upper case 408 of the housing of the portable computing device. As shown, openings 406 are configured to accept corresponding dual Thunderbolt connectors. In other embodiments, openings 406 are configured for accepting USB, serial and FireWire connectors, or other suitable connectors. Double stack gasket 400, which is electrically conductive, includes finger portions 404 and an elongated portion 402. It should be noted that finger portions 404 and elongated portion 402 can have any shapes, including a rectangular surfaces with straight edges. In addition, the double stack gasket can have any suitable number of finger portions 404 connected by an elongated portion 402. In some embodiments, double stack gasket 400 is made of a flexible and conductive foam material, such as a silicon foam material embedded with conductive particles. In one embodiment, the conductive particles include silver particles. In some embodiments, double stack gasket 400 is made of a single piece of conductive silicon material which is sculpted using, for example, die cuts to create the step or finger portions 404. In other embodiments, double stack gasket 400 is fabricated by adhering separate finger portions 404 to elongated portion 402 using, for example, a conductive adhesive.

Figure 6:
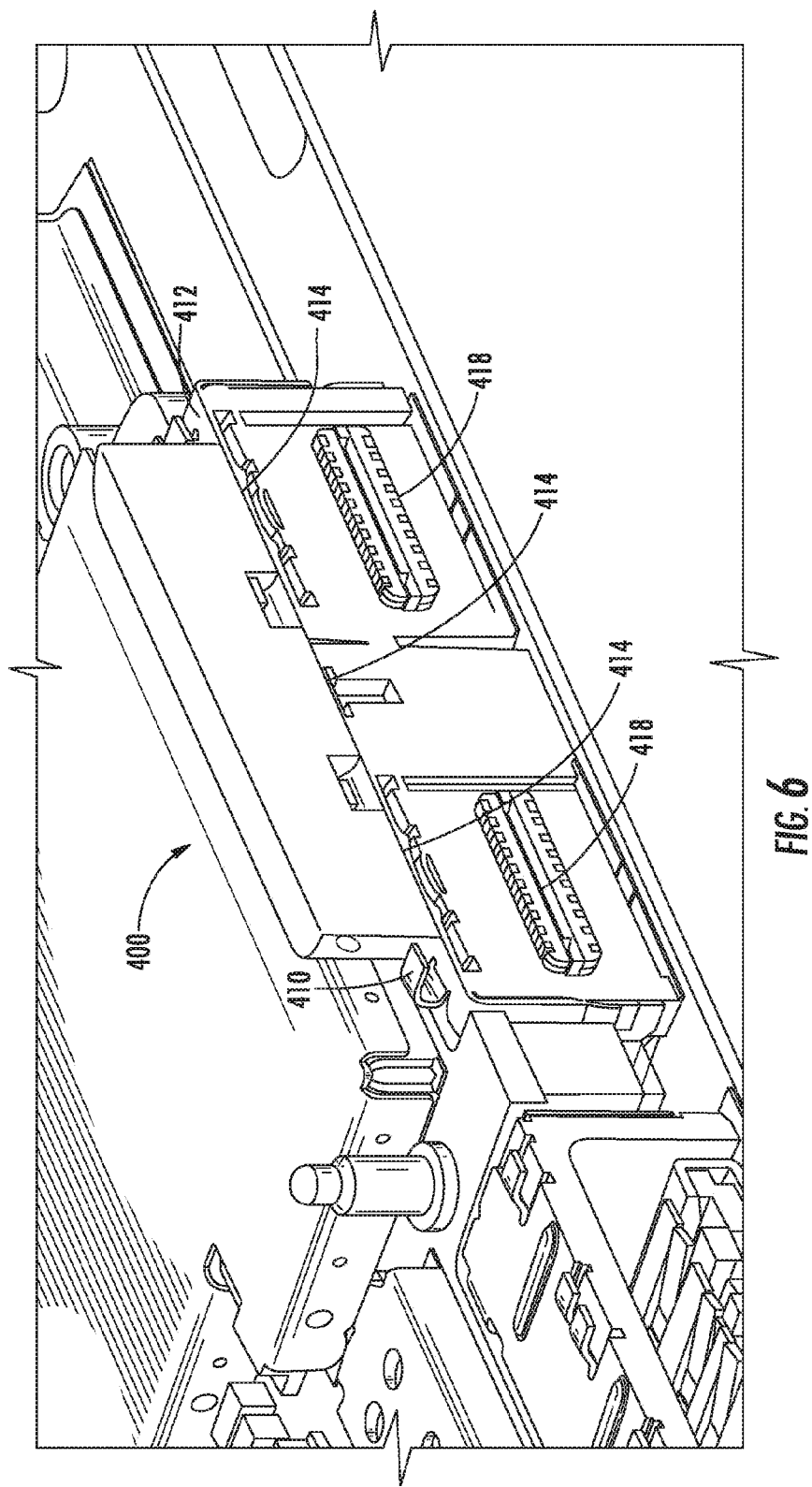
FIG. 6 illustrates a cross section view of the connector assembly of FIGS. 4 and 5.
Figure 7:
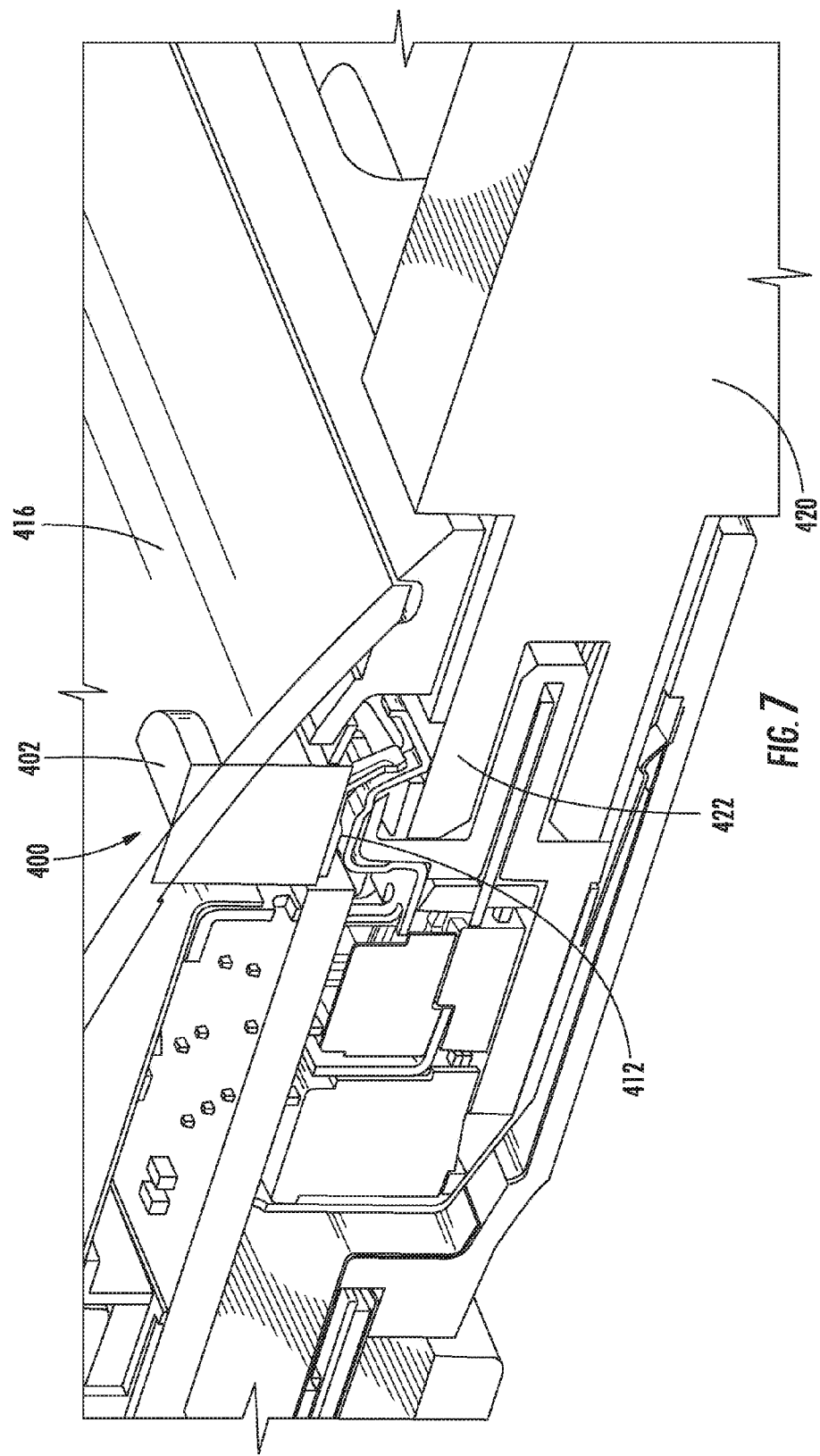
FIG. 7 illustrates a different cross section view of the connector assembly of FIGS. 4-6.

FIGS. 6 and 7 show cross section views of a connector assembly having a double stack gasket 400. Openings 406 are configured to substantially conform to receptacles 418. Receptacles 418 are configured to accept a connector 420, which is in turn configured to connect to an external device (not shown). Shield 412 surrounds receptacles 418 and is configured to make physical and electrical contact with portions of a connector of an external device. Shield 412 includes spring fingers 410 which can physically and electrically contact upper case 408 of the housing, thereby providing a low impedance conductive pathway to ground at upper case 408. Finger portions 404 can physically and electrically couple with metal shield 412 at interface 414. Finger portions 404 can be affixed to metal shield 412 using a conductive adhesive material. As shown in FIG. 7, when the portable computer is assembled, elongated portion 402 can make physical and electrical contact with bottom case 416. In addition, finger portions 404 can make physical and electrical contact with ground sheath 422 of connector 420. In some embodiments, bottom case 416 is anodized with a portion that is laser etched to provide a conductive contact for elongated portion 402. In this way, a ground path is formed between the external electronic device and the bottom case via the double stack gasket 400. In addition, from the perspective of a user who opens the bottoms case 416 to, for example repair the portable computer, the user will see elongated portion 402 of double stack gasket 400, which can be more cosmetically appealing compared to viewing individual finger portions 404.

MLB Features for Accommodating Regional Keyboards

Figure 8:
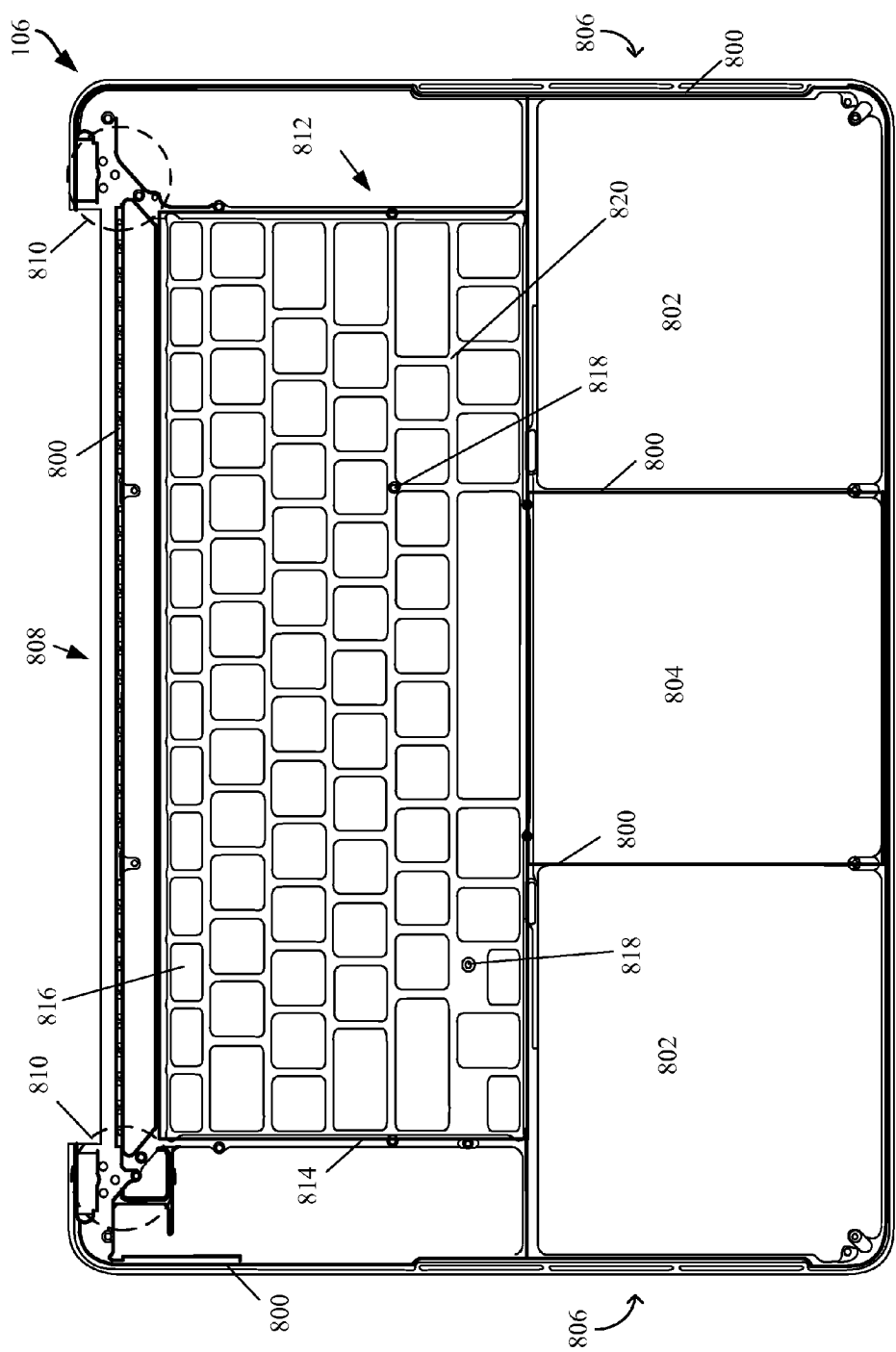
FIG. 8 illustrates a bottom-up view of top case of a portable computing device showing an integrated support system.

As described above, portable computing device 100 of FIGS. 1-3 has a base portion 12 which includes bottom case 104 and top case 106. Top case 106 has an integrated support system for supporting different structures of the computing device 100. FIG. 8 shows a bottom-up view of a top case 106 showing integrated support system 800 in accordance with the described embodiments. Generally speaking, top case 106 can be divided into various structural zones each of which can be expected to experience varying amounts and types of externally applied loads. For example, top case 106 can include palm rest zone 802 that can be expected to experience an external load applied by a user resting a palm or hand on top case 106 in the vicinity of palm rest zone 802. Keyboard zone 812 can include keyboard support rib 814 that surrounds and defines a keyboard opening in keyboard zone 812. Keyboard zone 812, which can also be referred to as a web, has a support structure 820 which has openings 816 formed therein to accommodate a keyboard positioned behind web 812. Web 812 is expected to experience an external load applied by a user during typing. Other structural zones can include touch pad zone 804, side vents zone 806, rear vent zone 808 and clutch bolt zone 810 each of which can be expected to experience varying amount and types of externally applied loads. Accordingly, integrated support system 800 can be configured in such a way to take into account the load expected at each of the structural zones.

Structural support system 800 can provide support elements (such as bosses) that can be used to mount internal components to top case 106. For example, web 812 has bosses 818 to which fasteners or stand-offs can be used to attach the MLB. Different geographical regions require different keyboard layouts. For example, Japan uses a Japanese Industrial Standard (JIS) keyboard layout, European countries use an International Standards Organization (ISO) keyboard layout and the United States uses an American National Standards Institute (ANSI) keyboard layout. Thus, web 812 can have different keyboard opening designs to accommodate different keyboard layouts depending on where a particular device is being sold.

Figure 9A:
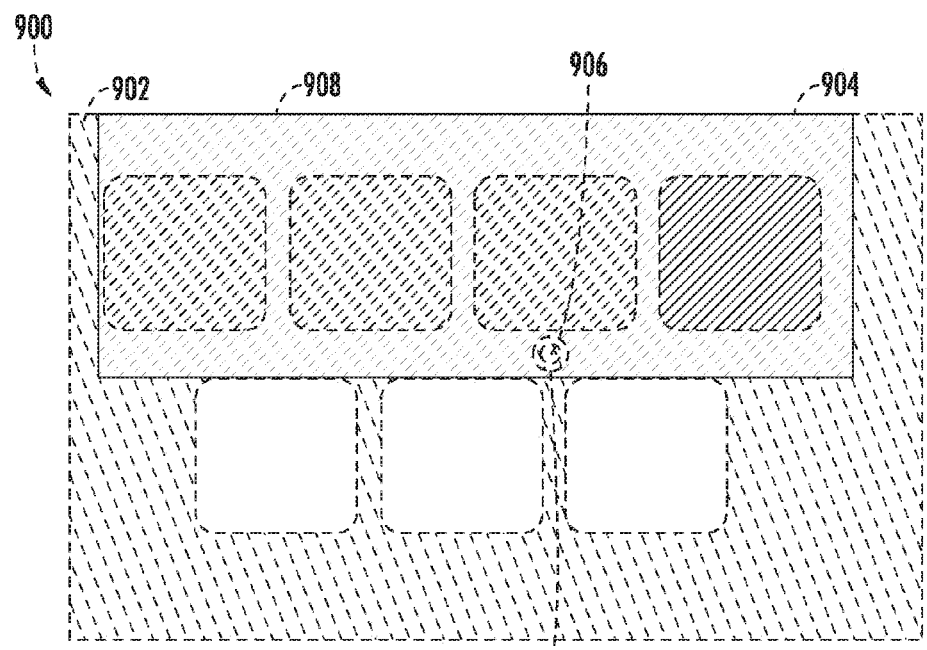
FIGS. 9A and 9B illustrate bottom-up views of portions of a keyboard web and main logic board assemblies.
Figure 9B:
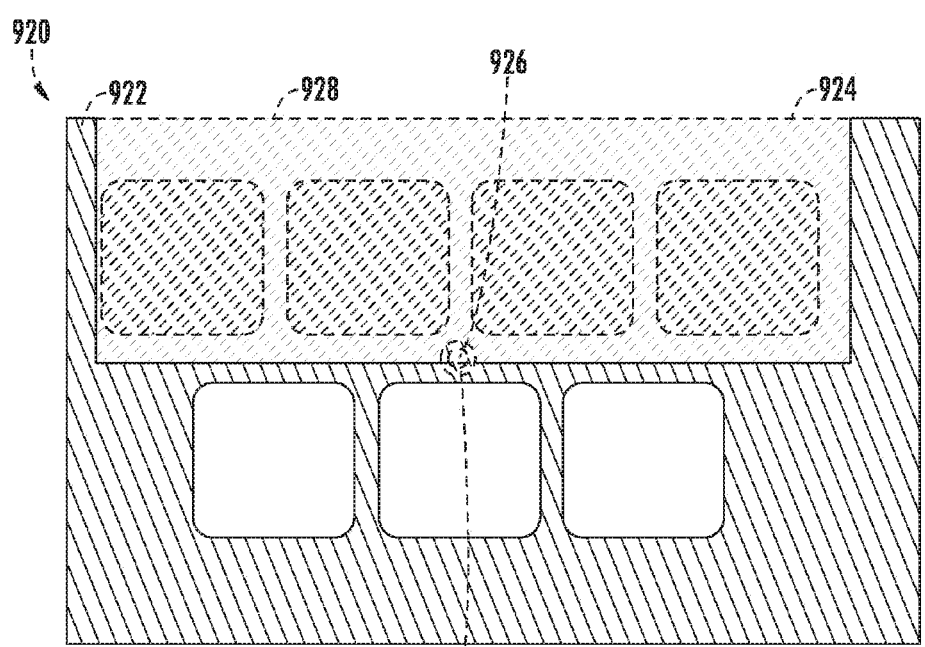

To illustrate, FIGS. 9A and 9B illustrate bottom-up views of portions of web and MLB assemblies with webs configured to accommodate ANSI and JIS keyboards, respectively. In FIG. 9A, assembly 900 includes ANSI web 902 having openings 904 to accommodate an ANSI keyboard (not shown). ANSI web 902 has boss 906 configured to accept a fastener or stand-off to couple web 902 to MLB 908. MLB 908 is partially positioned in front of web 902. MLB 908 has aperture 910, which is aligned with boss 906 of web 902, to accept the fastener or stand-off and to couple MLB 908 to web 902. In FIG. 9B, assembly 920 includes a JIS web 922 having openings 924 to accommodate a JIS keyboard (not shown). As shown, openings 924 of JIS web 922 are shifted in relation to openings 904 of ANSI web 902. JIS web 922 has boss 926 configured to accept a fastener or stand-off to couple web 922 to MLB 928. MLB 928 is positioned partially in front of web 922. MLB 928 has aperture 930, which is aligned with boss 926 of web 922, to accept the fastener or stand-off and to couple MLB 928 to web 922. As shown, in order to align with boss 926, part of aperture 930 is positioned off of an edge of MLB 928. When a fastener is used to couple MLB 928 to JIS web 922 via aperture 930 and boss 926, MLB 928 may not be adequately secured to web 922. In some cases, MLB 928 can fall off the fastener and decouple from web 922.

Figure 10A:
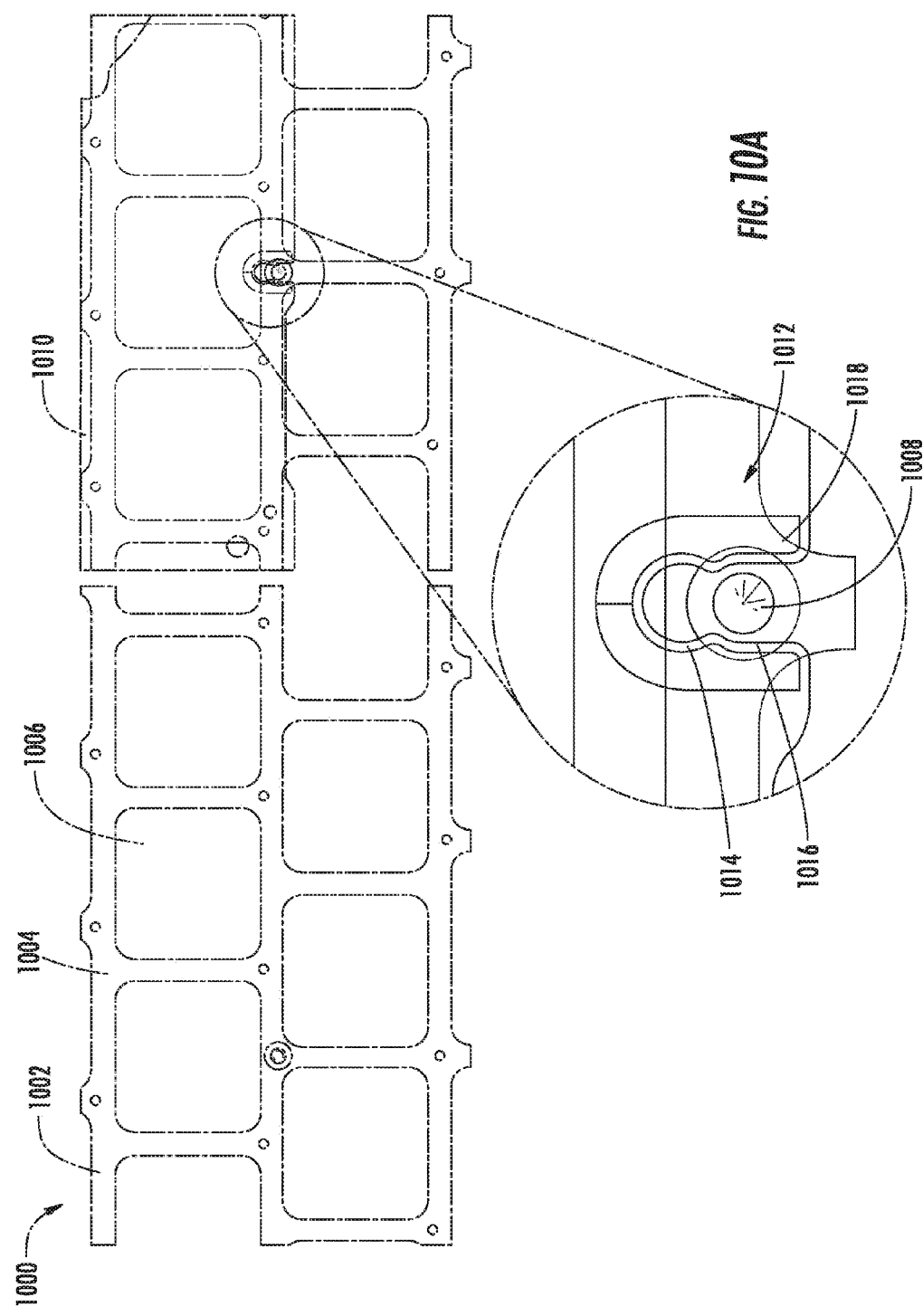

The embodiments herein provide features on an MLB in order to accommodate different types of keyboard layouts using a single design. FIGS. 10A and 10B illustrate bottom-up views of portions of keyboard assemblies which include one type of MLB that is adapted to accommodate different webs having different keyboard layouts. FIG. 10A shows an ANSI web 1002 with a support structure 1004 having a number of openings 1006 configured to accept an ANSI keyboard. MLB 1010 is positioned in front of ANSI web 1002. As shown in the inset view, ANSI web 1002 has boss 1008 which is configured to accept a fastener or stand-off for supporting MLB 1010. MLB 1010 has notch 1012 which includes a first portion 1014 and a second portion 1016, each configured to accept a fastener such as a screw. First portion 1014 is substantially circular in shape and second portion 1016 is at an edge of MLB. Second portion 1016 is aligned with boss 1008 of ANSI web 1002 such that a fastener or stand-off can be positioned there through to securely fasten MLB 1010 to ANSI web 1002. In some embodiments, gripping feature 1018 is provided, which can include a high friction surface to provide extra support for the fastener. Gripping feature 1018 can be, for example, a textured portion of the MLB produced, for example, by etching the MLB. Alternatively, gripping feature 1018 can be a compressible material such as silicone or rubber that is affixed to or not affixed to MLB 1010.

FIG. 10B shows a JIS web 1022 with a support structure 1024 having a number of openings 1026 configured to accept a JIS keyboard. MLB 1010 is positioned partially in front of JIS web 1022. Note that MLB 1010 can also be used with an ANSI web as shown in FIG. 10A. As shown in the inset view, JIS web 1022 has boss 1028 which is configured to accept a fastener or stand-off for supporting MLB 1010. MLB 1010 has notch 1018 which includes a first portion 1014 and a second portion 1016, each configured to accept a fastener such as a screw. First portion 1014 is aligned with boss 1028 of JIS web 1022 such that a fastener or stand-off can be positioned there through to securely fasten MLB 1010 to JIS web 1022. As with the ANSI web, in some embodiments, gripping feature 1018 is used to provide a high friction surface for extra support for the fastener. Thus, as shown by FIGS. 10A and 10B, MLB 1010 can be used for both ANSI and JIS webs. In some embodiments, the MLB can have a notch that can accommodate three or more types of webs, such as webs to accommodate ISO and other keyboard configurations.

FIGS. 11A-11D illustrate different notch shapes for an MLB to accommodate different types of keyboards in accordance with described embodiments. FIG. 11A shows notch 1100 having a substantially circular first portion 1102 and second portion 1104 shaped to fit a fastener and positioned at the edge of the MLB. FIG. 11B shows notch 1106 having substantially circular first 1108 and second portions 1110. FIG. 11C shows notch 1112 with first 1114 and second 1116 portions together forming a substantially oval shape. FIG. 11D shows notch 1118 with first 1120 and second 1122 portions together forming a substantially oval shape and second portion 1122 having tapered regions 1124 next to the edge of the MLB.

MLB Thin Section Support

As described above the MLB can play a central role in the functioning of portable computing device 100. As such, it is important that the MLB be protected from damage that can occur during assembly of the portable computing device. FIG. 12 illustrates top-down view of a portion of a bare printed circuit board (PCB) 1200 of an MLB in accordance with described embodiments. PCB 1200 can have features for mounting a number of components as part of the MLB. The base of PCB 1200 is generally made of an insulating material such as a resinous material. As shown, PCB 1200 has a cut out 1202 for accommodating a fan or blower (not shown) for cooling the portable computing device. The fan or blower can be coupled to PCB 1200 using fasteners to fasten PCB 1200 to the fan or blower via openings 1204. As shown, PCB 1200 has a thin section 1206 where PCB 1200 has a small length relative to a wider section of PBC 120 having a maximum length 1208. In some embodiments, the thickness of PCB is about 1 mm and thin section 1206 is about 11-12 mm in length. Because of its relative thinness, PCB 1200 at thin section 1206 can subject to mechanical strain during assembly of the portable computing device and can thus be considered a mechanically weak region of PCB 1200. If components, such as integrated chips, and/or connectors are already assembled on PCB 1200, bending or twisting of PBC 1200 at thin section 1206 can cause damage to the components and/or wires near thin section 1206. Bending or twisting at thin section 1206 can occur, for example, when PCB is being assembled into the housing of the portable computing device.

Figure 13B:
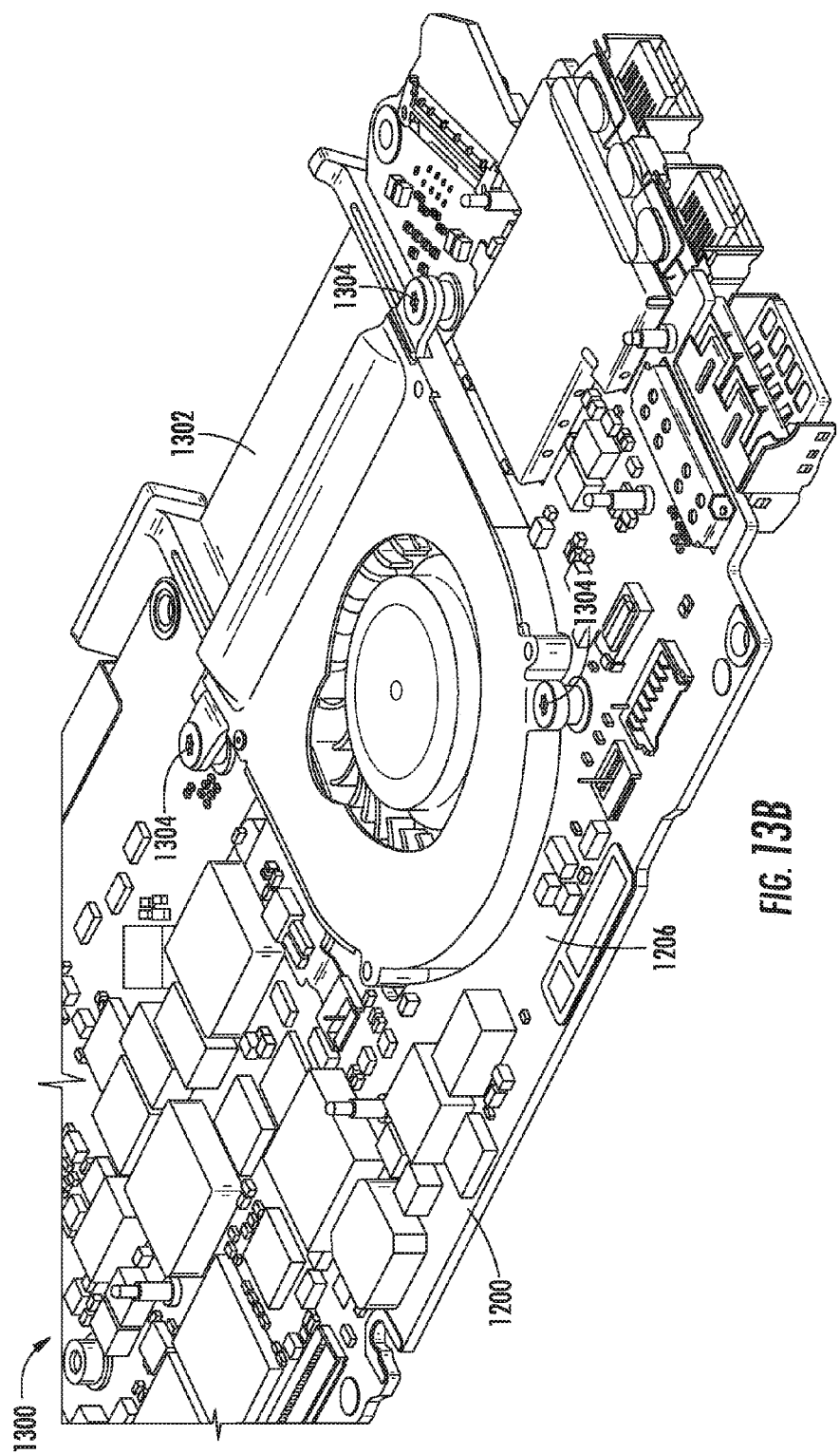

FIGS. 13A and 13B illustrate top-down and isometric views of assembly 1300 which includes PCB 1200 and fan 1302 assembled in cut out 1202. As shown, fasteners 1304 are used to secure fan 1302 to PCB 1200. When fan 1302 is positioned in cut out 1202 and attached to PCB 1200, thin section 1206 is adequately supported. In some embodiments, fan 1302 is not assembled onto PCB 1200 until after PCB 1200 is assembled in the housing of the portable computing device, thereby leaving thin section 1206, and nearby components, vulnerable to damage from handling.

Figure 14A:
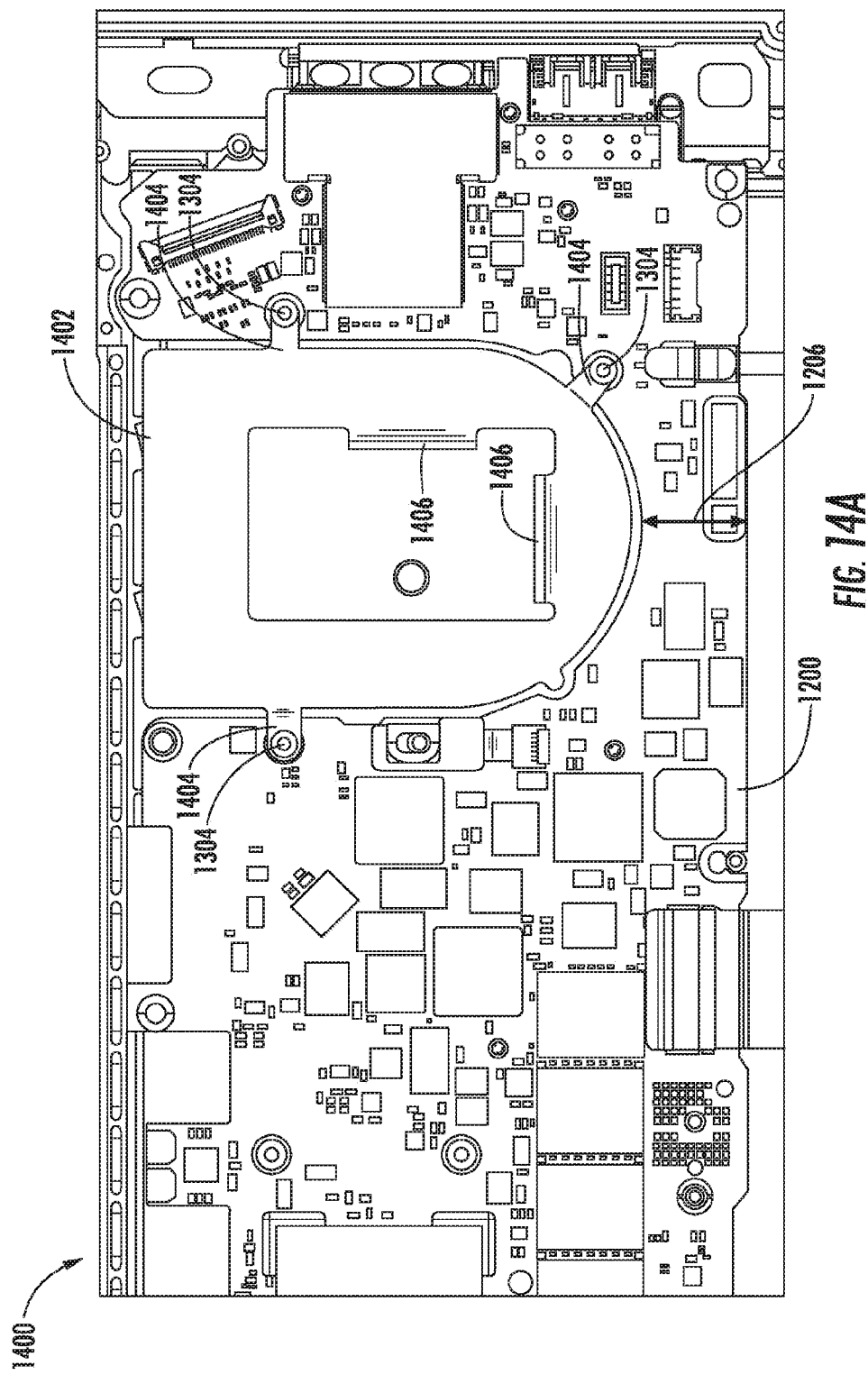
FIGS. 14A and 14B illustrate top-down and isometric view, respectively, of the MLB of FIG. 12 with a bracket installed the cut out of the PCB.
Figure 14B:
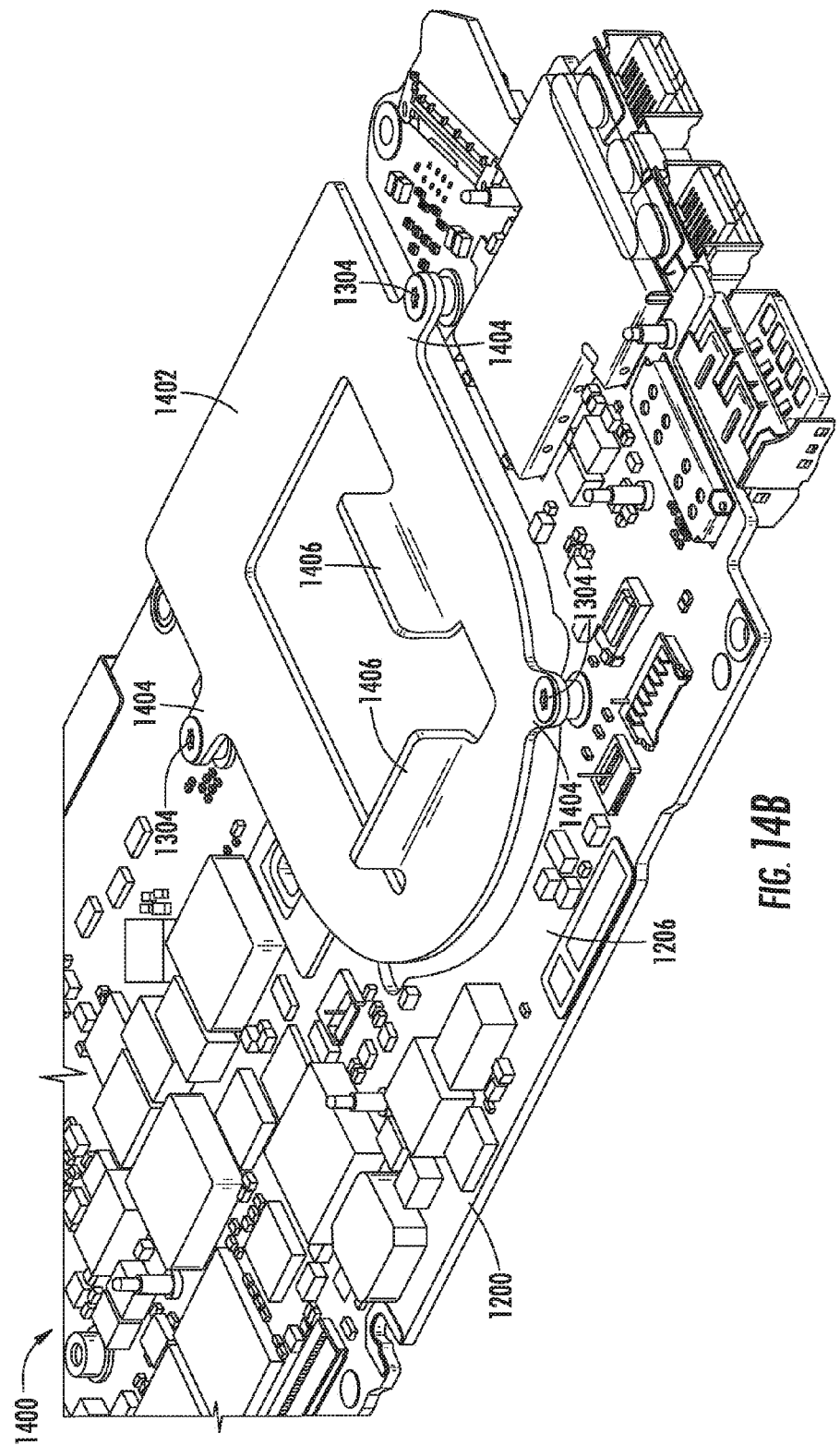

In accordance with described embodiments, a bracket can be positioned in cut out 1202 in order to mechanically support thin section 1206 from mechanical strain. FIGS. 14A and 14B illustrate top-down and isometric views of assembly 1400 which includes PCB 1200 and bracket 1402 assembled in cut out 1202. As shown, bracket 1402 is configured to have the size and shape corresponding to cut out 1202 so that bracket can be positioned in cut out 1202 and attached to PCB 1200 using fasteners 1304. Note that bracket 1402 is configured to have attachment features 1404 positioned such that fasteners 1304 can be used to secure bracket 1402 to PCB 1200 via corresponding openings 1204, which are the same openings 1204 used to attach fan 1302 to PCB 1200. Any suitable fasteners can be used, for example, screws, bolts, clips, snapping features, spring clamps and/or magnets can be used. By mounting bracket 1402 in cut out 1204, thin section 1206 can experience less mechanical strain during handling compared to when cut out 1204 is empty, as shown in FIG. 12. Bracket 1402 can be made of any suitable material capable of supporting thin section 1206. For example, bracket 1402 can be made of sheet metal, durable plastic material or resinous material similar to the base of PCB 1200. In some embodiments, bracket 1402 can have bended portions 1406 that protrude substantially perpendicularly from at a surface of bracket 1402. Bended portions 1406 can be used as stops to align PCB 1200 to a reference surface (e.g., corresponding stops attached to the housing) to assure proper alignment of PCB 2100 during assembly of PCB 1200 in the portable computer device. In addition, bended portions can be used as handles such that a handler can mount and remove bracket 1402 to/from PCB 1200 more easily. Bracket 1402 can be mounted in PCB 1200 prior to any operation involving handing such as mounting components onto PCB 1200 and assembling PCB 1200 in the housing of the portable computing device.

Figure 15:
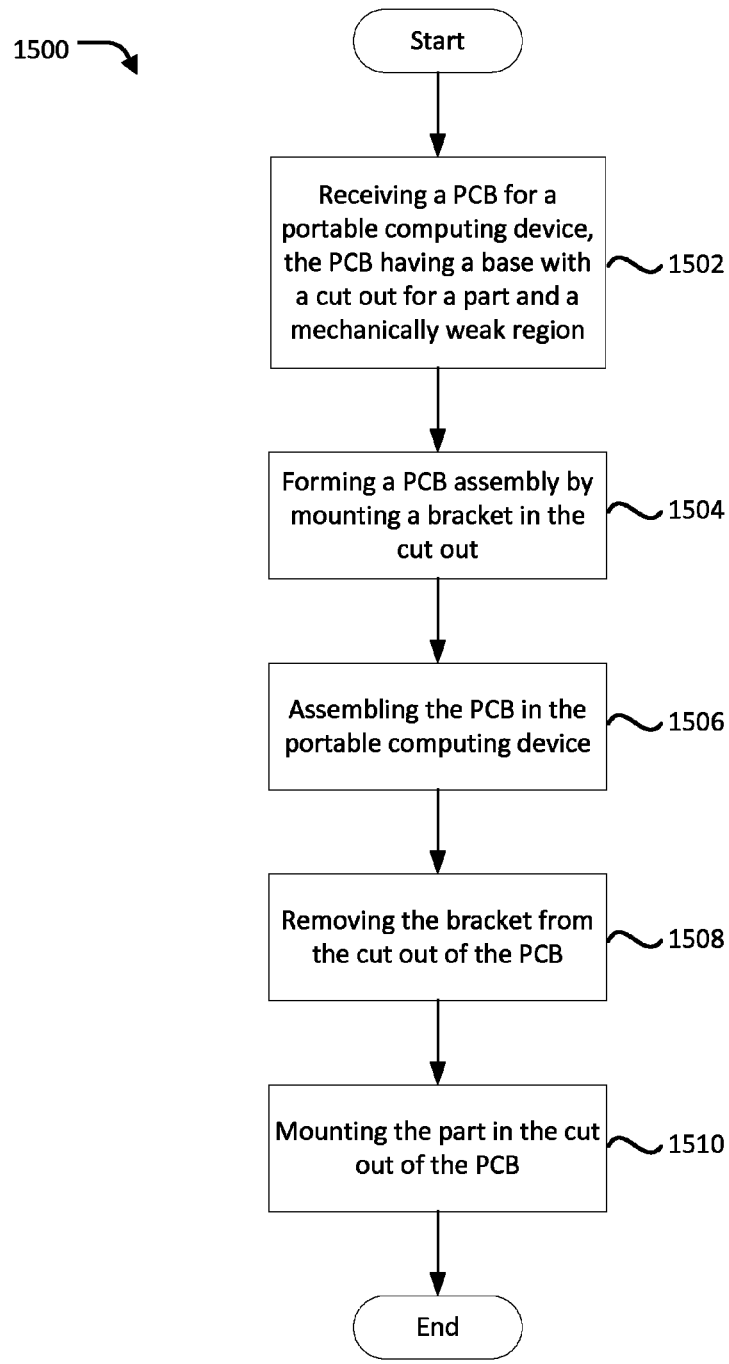
FIG. 15 is a flowchart showing process steps for assembling a PCB having bracket in a portable computing device.

FIG. 15 is a flowchart 1500 showing process steps of an embodiment for assembling a PCB in a portable computing device. At 1502, a PCB having a base with a cut out for a part and a mechanically weak region, as described above, is received. The cut out can have a size and shape to accept a part therein. The part can be any suitable part mounted on a PCB. In some embodiments, the part is a fan or blower to keep the portable computing device cool during operation. The mechanically weak region can be a thin section of the base that can experience mechanical strain during handling of the PCB when the cut out is empty. That is, the mechanically weak region can have reduced dimensions relative to other portions of the base. At 1504, a PCB assembly is formed by mounting a bracket in the cut out. The bracket can have a size and shape corresponding to the cut out. When the bracket is mounted in the cut out, the mechanically weak region can experience less mechanical strain compared to when the cut out is empty. Note that in some embodiments, components can be mounted before or after the bracket is mounted in the cut out. At 1506, the PCB assembly is assembled in the portable computing device. During assembly into portable computing device, the PCB assembly can be subject to handling. Since the bracket is mounted in the PCB, the weak region can be adequately supported to avoid mechanical strain to the weak region and any surrounding components or cables. At 1508, the bracket is removed from the cut out. Thus, the bracket is a temporary structure that provides support for the PCB during assembly before the part is installed. At 1510, the part is mounted in the cut out of the PCB. It should be noted that the bracket can be reused in supporting a PCB during the assembly of another PCB in another portable computing device.

Antenna Cable Shield and Separator

Referring again to FIG. 1, portable computing device 100 can have a number of antennas, such as WiFi, 3G and/or Bluetooth antennas, for transmitting and/or receiving electromagnetic frequencies during operation of portable computing device 100. The antennas can be sensitive to the noise floor of portable computing device 100. In general, the noise floor is the measure of the signal power created from the sum of the electromagnetic noise sources and unwanted signals within a measurement system, where noise is defined as any signal other than the one being monitored. In portable computing device 100, the noise floor can include electromagnetic noise emitted from components and connectors on the MLB, which can reduce the sensitivities of the antennas that are in proximity to such components and connectors.

FIG. 16A illustrates a top-down view of a portion of MLB 1600 that can be part of portable computing device 100. MLB 1600 has mounted thereon radio card 1602 having connectors 1604 and antenna cables 1606. Antenna cables 1606 are, in turn, connected to an antenna (not shown). Radio card 1602 can process radio signals received and/or transmitted from/to antenna via antenna cables 1606. High-definition multimedia interface (HDMI) receptacle 1608 is positioned at an edge of MLB 1600 and is configured to connect to and communicate with a corresponding HDMI connector for an external device. Shield 1610 is positioned between radio card 1602 and HDMI receptacle 1608 and is used to reduce the electromagnetic noise generated by HDMI receptacle 1608 that can be experienced by radio card 1602. Shield 1610 can be made of suitable material such as sheet metal. Although shield 1610 can reduce the amount of noise generated by HDMI receptacle 1608 experienced by radio card 1602 and antenna cables 1606, shield 1610 can itself emit electromagnetic noise due to its proximity to HDMI receptacle 1608. Since antenna cables 1606 are positioned on top of shield 1610, antenna cables 1606 can experience noise emitted from shield 1610. Methods described herein are used to reduce the electromagnetic noise generated by shield 1610 and maximize the sensitivity of the antenna to wireless signals.

FIGS. 16B and 16C illustrate top-down and cross-section perspective views, respectively, of a portion of MLB 1600 with a separator 1612 positioned on top of shield 1610. In some embodiments, separator 1612 is positioned over a portion of shield 1610. Separator 1612 can be made of any suitable insulator material such as a polymer material (e.g., Mylar) or a durable plastic material. Separator 1612 can also be made of an RF absorbing material which can further reduce the radio frequency noise experienced by the antenna cable. In some embodiments, the choice of material for separator 1612 can partially be made based on the cosmetic reasons. For example, the color of separator 1612 can be chosen to match the color of nearby components housed within the portable computing device. Separator 1612 provides a distance gap between antenna cables 1606 and shield 1610 and can reduce electromagnetic noise that antenna cables 1606 can experience from emitted from shield 1610. In some embodiments, separator 1612 can be less than 1 mm in thickness. In certain embodiments, separator 1612 can have features to affix or snap on antenna cables 1604 to separator 1612 in order to secure and prevent movement of antenna cables 1604. Separator 1612 can be secured on shield using, for example, an adhesive. In some cases, separator 1612 has bend portions so that it can couple with side portions of shield 1610.

Figure 17:
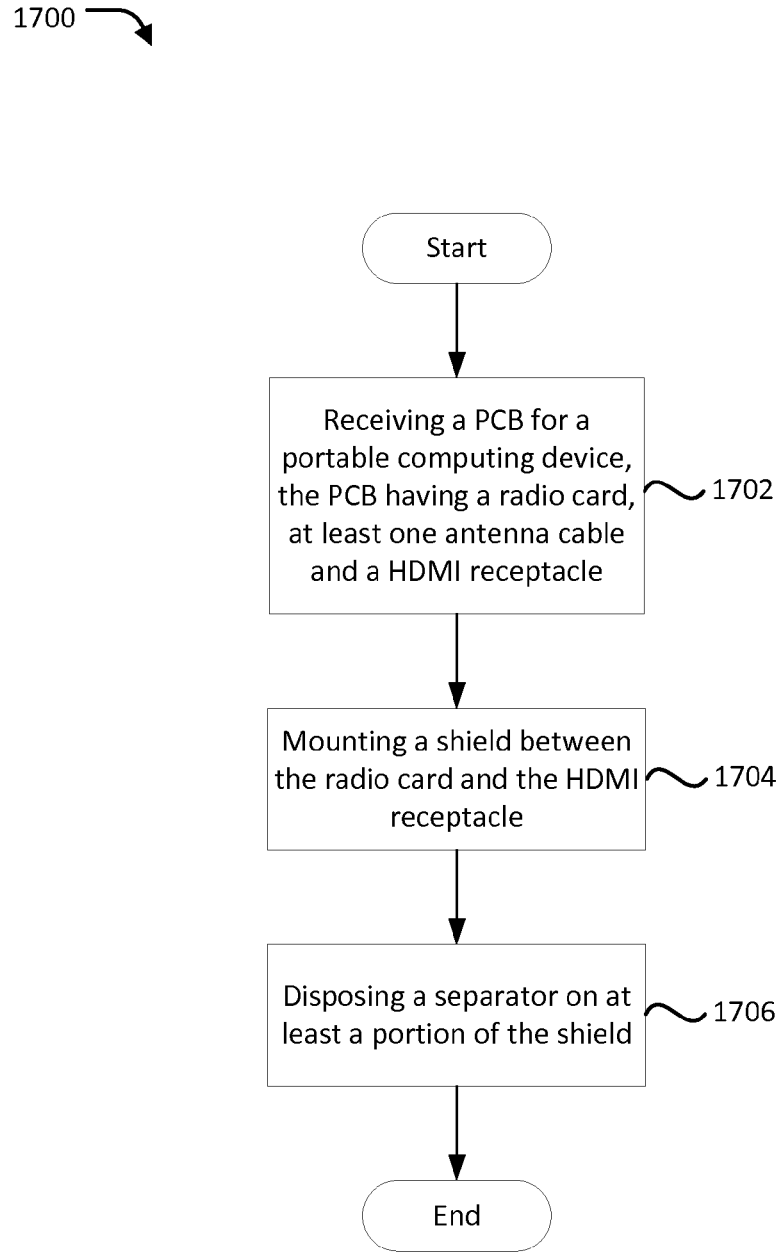
FIG. 17 is a flowchart showing process steps for shielding an antenna cable of a portable computing device.

FIG. 17 is a flowchart 1700 showing process steps of an embodiment for shielding an antenna cable of a portable computing device. At 1702, a printed circuit board having a base with a radio card and an HDMI receptacle mounted on the base is provided. The radio card can have at least one connector for attaching an antenna cable thereto. The HDMI receptacle is positioned at the edge of the base. At 1704, a shield is mounted on the base between the radio card and the HDMI receptacle. As described above, the shield can reduce the electromagnetic noise experienced by the radio card and the antenna cable generated by HDMI receptacle. At 1706, a separator is disposed on at least a portion of the surface of the shield. As described above, the separator can reduce electromagnetic noise experienced by the antenna cable emitted from the shield by providing a distance gap between the antenna cable and the shield.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method of assembling a printed circuit board in a portable computing device, the method comprising:
    receiving a printed circuit board, the printed circuit board having a base which has a plurality of attachment features for attaching a plurality of components to the base, wherein the base has a cut out having the size and shape to accept a part therein, wherein the base has a mechanically weak region which can experience mechanical strain during handling when the cut out is empty, wherein the mechanically weak region has reduced dimensions relative to other portions of the base;
    forming a printed circuit board assembly by mounting a bracket in the cut out, the bracket having a size and shape corresponding to the cut out, wherein the mechanically weak region experiences less mechanical strain when the bracket is positioned in the cut out and attached to the base compared to when the cut out is empty;
    assembling the printed circuit board assembly in the portable computing device;
    removing the bracket from the cut out of the printed circuit board; and
    mounting the part in the cut out of the printed circuit board.

2. The method as recited in claim 1, further comprising, prior to assembling the printed circuit board assembly in the portable computing device, mounting the plurality of components on the printed circuit board.

3. The method as recited in claim 1, further comprising, after removing the bracket, forming a second printed circuit board assembly by mounting the bracket in a second cut out of a second printed circuit board, wherein the a second printed circuit board has a second base having a second mechanically weak region which can experience mechanical strain during handling when the second cut out is empty.

4. The method of claim 1, wherein the printed circuit board is part of a main logic board of the portable computing device.

5. The method of claim 1, wherein the part is a fan for cooling the portable computing device.

6. The method of claim 1, wherein the bracket is comprised of a sheet metal material.

7. The method of claim 1, wherein the printed circuit board is comprised of a resinous material.

8. The method of claim 1 wherein the bracket has at least one bent portion that protrudes substantially perpendicular from a planar surface of the bracket.

9. The method of claim 8 wherein the at least one bent portion aligns the printed circuit board within the portable computing device.

10. The method of claim 1 wherein the bracket is mounted in the cut out with one or more fasteners that are secured within one or more openings within the printed circuit board.

11. The method of claim 10 wherein the one or more openings within the printed circuit board are also used to mount the part in the cut out.

12. A method of assembling a printed circuit board in a portable computing device, the method comprising:
    receiving a printed circuit board, the printed circuit board having a cut out sized to accommodate a fan component;
    receiving a bracket having geometry similar to the fan component and attaching the bracket to the printed circuit board;
    assembling the printed circuit board assembly in the portable computing device;
    removing the bracket from the cut out of the printed circuit board; and
    mounting the fan component in the cut out of the printed circuit board.

13. The method of claim 12 wherein the bracket has at least one bent portion that protrudes substantially perpendicular from a surface of the bracket.

14. The method of claim 13 wherein the at least one bent portion aligns the printed circuit board within the portable computing device.

15. The method of claim 12, further comprising, prior to assembling the printed circuit board assembly in the portable computing device, mounting a plurality of components on the printed circuit board.

16. The method of claim 12, further comprising, after removing the bracket, forming a second printed circuit board assembly by mounting the bracket in a second cut out of a second printed circuit board.

17. The method of claim 12, wherein the printed circuit board is part of a main logic board of the portable computing device.

18. The method of claim 12, wherein the fan is used to cool the portable computing device.

19. The method of claim 12, wherein the bracket is comprised of a sheet metal material.

20. The method of claim 12, wherein the printed circuit board is comprised of a resinous material.

21. The method of claim 12 wherein the bracket is mounted in the cut out with one or more fasteners that are secured to one or more openings within the printed circuit board.

22. The method of claim 12 wherein the one or more openings within the printed circuit board are also used to mount the part in the cut out.

* * * * *